United States Patent
Kuge

(10) Patent No.: US 10,033,339 B2
(45) Date of Patent: Jul. 24, 2018

(54) SEMICONDUCTOR DEVICE, SEMICONDUCTOR SYSTEM, AND CONTROL METHOD OF SEMICONDUCTOR DEVICE

(71) Applicant: Renesas Electronics Corporation, Tokyo (JP)

(72) Inventor: Hiroyuki Kuge, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/422,493

(22) Filed: Feb. 2, 2017

(65) Prior Publication Data

US 2017/0288621 A1    Oct. 5, 2017

(30) Foreign Application Priority Data

Mar. 30, 2016 (JP) .................................. 2016-067877

(51) Int. Cl.
*H03F 3/45* (2006.01)
*H03F 1/02* (2006.01)

(52) U.S. Cl.
CPC ....... *H03F 3/45179* (2013.01); *H03F 1/0205* (2013.01); *H03F 2200/129* (2013.01); *H03F 2203/45116* (2013.01)

(58) Field of Classification Search
CPC .......................... H03F 3/45; H03F 2203/45074
USPC ......................................... 330/258, 259, 301
See application file for complete search history.

(56) References Cited

U.S. PATENT DOCUMENTS

| 5,381,112 A * | 1/1995 | Rybicki | H03F 3/45112 330/253 |
|---|---|---|---|
| 7,696,793 B2 | 4/2010 | Sunairi | |
| 2005/0068309 A1* | 3/2005 | Chang | G09G 3/20 345/204 |
| 2007/0115059 A1* | 5/2007 | Ivanov | H03H 19/004 330/255 |

FOREIGN PATENT DOCUMENTS

JP          4858959 B2    1/2012

* cited by examiner

*Primary Examiner* — Steven J Mottola
(74) *Attorney, Agent, or Firm* — Mattingly & Malur, PC

(57) ABSTRACT

A semiconductor device includes a differential amplification circuit that outputs differential output signals Vo1 and Vo2, external output terminals PD1 and PD2 to which one of the differential output signals Vo1 and Vo2 and single end signals Vo3 and Vo4 is selectively supplied, switch units SW1 and SW2 that control a conduction state between the external output terminal PD1 and the feedback line and a conduction state between the external output terminal PD2 and the feedback line, respectively, resistance elements R1 and R2 respectively provided in series with the switch units SW1 and SW2, a CMFB circuit that controls a common mode voltage of the differential amplification circuit according to a difference between an intermediate voltage Vcm of the external output terminals PD1 and PD2 in the feedback line and a reference voltage Vref, and a switch unit SW3 that controls to supply a clamp voltage to the feedback line.

17 Claims, 22 Drawing Sheets

SEMICONDUCTOR DEVICE, SEMICONDUCTOR SYSTEM, AND CONTROL METHOD OF SEMICONDUCTOR DEVICE

CROSS-REFERENCE TO RELATED APPLICATIONS

This application is based upon and claims the benefit of priority from Japanese patent application No. 2016-067877, filed on Mar. 30, 2016, the disclosure of which is incorporated herein in its entirety by reference.

BACKGROUND

The present invention relates to a semiconductor device, a semiconductor system, and a control method of the semiconductor device, and relates to, for example, a semiconductor device, a semiconductor system, and a control method of the semiconductor device suitable for suppressing an increase in a size of a circuit.

Japanese Patent No. 4858959, for example, discloses a configuration of generating low voltage differential signaling (LVDS) data signals. The low voltage differential signaling data signals are used, for example, to transfer data from a microcomputer to a liquid crystal display device.

SUMMARY

In recent years, depending on the specification, it may be required to switch from the low voltage differential signaling data signals to single end signaling data signals having an amplitude range wider than the amplitude range of the low voltage differential signaling data signals to transfer data.

However, when both an external output terminal that outputs the low voltage differential signaling data signals and an external output terminal that outputs the single end signaling data signals are provided in the semiconductor device, the number of external output terminals increases, which results in an increase in the size of the circuit. The other problems of the related art and the novel characteristics of the present invention will be made apparent from the descriptions of the specification and the accompanying drawings.

According to one embodiment, a semiconductor device includes: a differential amplification circuit that amplifies differential input signals and outputs differential output signals; first and second output terminals to which one of the differential output signals and first and second single end signals is selectively supplied according to an operation mode; a feedback line; first and second switch units that control a conduction state between the first output terminal and the feedback line and a conduction state between the second output terminal and the feedback line, respectively; first and second resistance elements respectively provided in series with the first and second switch units; a common mode feedback circuit that controls a common mode voltage of the differential amplification circuit according to a difference between an intermediate voltage of the first and second output terminals in the feedback line and a reference voltage; and a third switch unit that controls whether to supply a predetermined clamp voltage to the feedback line.

According to another embodiment, a control method of a semiconductor device includes, in a first mode, connecting a first output terminal and a feedback line via a first resistance element and connecting a second output terminal and the feedback line via a second resistance element by turning on both first and second switch units; controlling a common mode voltage of a differential amplification circuit according to a difference between a voltage on the feedback line and a reference voltage; and outputting one of differential output signals output from the differential amplification circuit in accordance with differential input signals to outside via the first output terminal and outputting the other one of the differential output signals output from the differential amplification circuit in accordance with the differential input signals to outside via the second output terminal, and in a second mode, disconnecting the connection between the first output terminal and the feedback line and the connection between the second output terminal and the feedback line by turning off both the first and second switch units; supplying a predetermined clamp voltage to the feedback line; and outputting first and second single end signals to outside via the first and second output terminals, respectively.

According to the embodiment, it is possible to provide a semiconductor device, a semiconductor system, and a control method of the semiconductor device capable of suppressing an increase in a size of a circuit by selectively outputting one of differential signals and single end signal from common output terminals.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
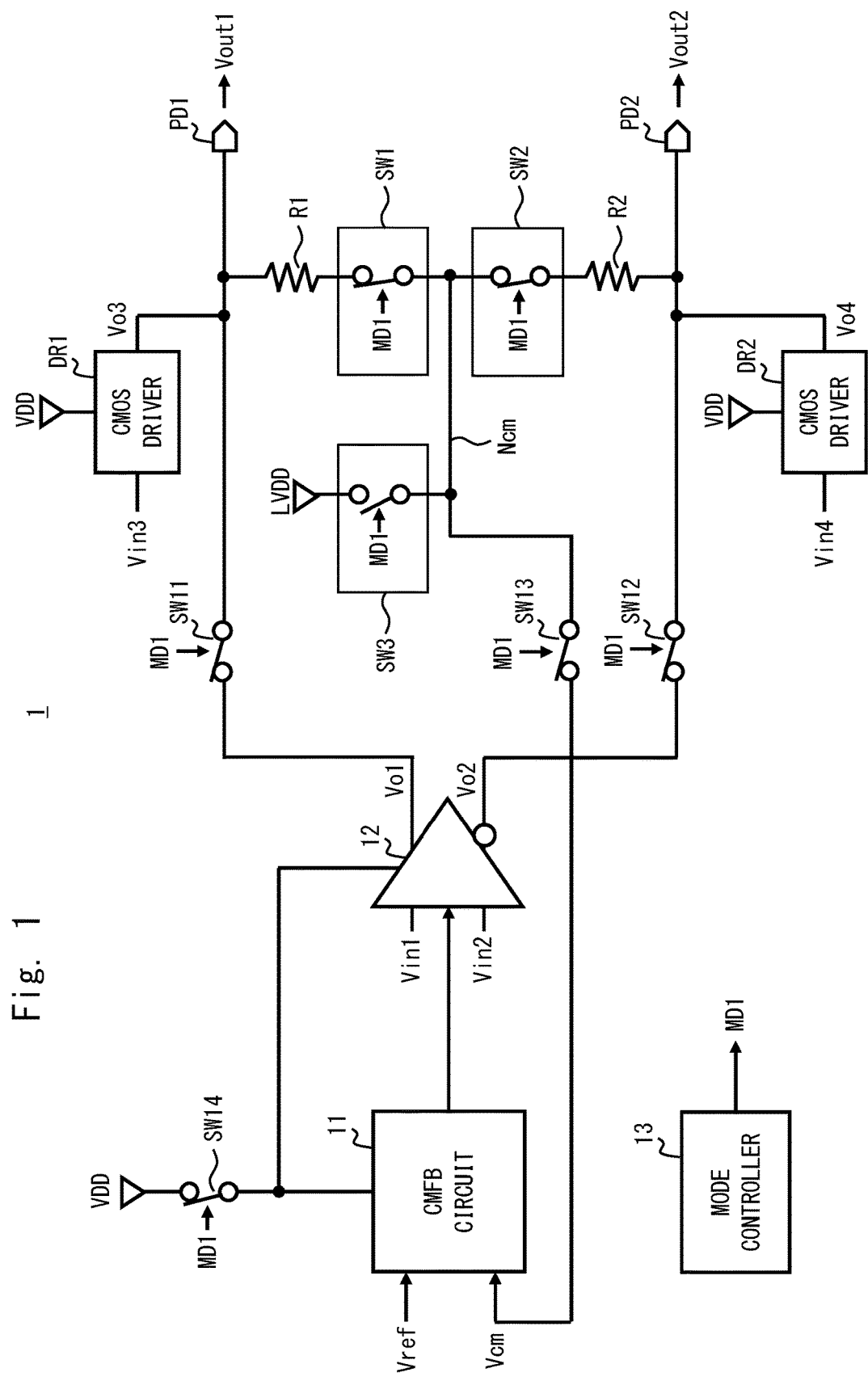
FIG. 1 is a block diagram showing a configuration example of a semiconductor device according to a first embodiment.

Embodiments of the present invention will be described below with reference to the accompanying drawings. Note that the drawings are in simplified form, and the technical scope of the embodiments should not be interpreted to be limited to the drawings. The same elements are denoted by the same reference numerals, and a duplicate description is omitted.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used.

Further, in the following embodiments, the components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

First Embodiment

FIG. 1 is a block diagram showing a configuration example of a semiconductor device according to a first embodiment. The semiconductor device according to this embodiment selectively outputs, for example, low voltage differential signaling data signals or single end signaling data signals to a liquid crystal display device from a common external output terminal. The semiconductor device according to this embodiment is therefore able reduce the number of external output terminals, whereby it is possible to suppress an increase in the size of the circuit. Hereinafter, this embodiment will be described in detail.

As shown in FIG. 1, a semiconductor device 1 is formed, for example, on a semiconductor chip and includes a common mode feedback circuit (hereinafter it will be referred to as a CMFB circuit) 11, a differential amplification circuit 12, a mode controller 13, switch units SW1-SW3, switch units SW11-SW14, resistance elements R1 and R2, CMOS drivers DR1 and DR2, and external output terminals PD1 and PD2.

The differential amplification circuit 12 amplifies differential input signals Vin1 and Vin2 and outputs differential output signals Vo1 and Vo2 in an LVDS operation mode (a first mode or a low voltage differential signal output mode). The differential output signals Vo1 and Vo2 are respectively supplied to the external output terminals PD1 and PD2 and are output to outside as differential output signals Vout1 and Vout2. The differential amplification circuit 12 operates with a first power supply voltage VDD1 supplied as power supply voltages and with a ground voltage GND in the LVDS operation mode.

The CMFB circuit 11 performs control so that a common mode voltage Vcm matches a reference voltage Vref in accordance with a difference between an intermediate voltage between the external output terminals PD1 and PD2 (that is, a common mode voltage of the differential output signals Vo1 and Vo2) Vcm and the reference voltage Vref, which is the target voltage of the common mode voltage in the LVDS operation mode. The CMFB circuit 11 operates with the first power supply voltage VDD1 supplied as the power supply voltages and with the ground voltage GND in the LVDS operation mode.

The CMOS driver DR1 drives, in a CMOS operation mode (a second mode or a single end signal output mode), a single end signal Vin3 and outputs a single end signal Vo3. The CMOS driver DR2 drives, in the single end signal output mode, a single end signal Vin4 and outputs a single end signal Vo4. The CMOS drivers DR1 and DR2 each operate with a second power supply voltage VDD2 whose voltage level is higher than that of the first power supply voltage VDD1 supplied as the power supply voltages and with the ground voltage GND in the CMOS operation mode.

The switch unit SW1 is provided between the external output terminal PD1 and a node Ncm (feedback line) and is controlled to be turned on or off according to the operation mode. The resistance element R1 is a resistance element having a high resistance and is provided in series with the switch unit SW1 between the external output terminal PD1 and the node Ncm.

The switch unit SW2 is provided between the external output terminal PD2 and the node Ncm and is controlled to be turned on or off according to the operation mode. The resistance element R2 is a resistance element having a high resistance and is provided in series with the switch unit SW2 between the external output terminal PD2 and the node Ncm.

The switch unit SW3 is switched on or off according to the operation mode and controls whether to supply a clamp voltage according to the first power supply voltage VDD1 to the node Ncm.

The switch unit SW11 is provided between one output terminal of the differential amplification circuit 12 and the external output terminal PD1 and is controlled to be turned on or off according to the operation mode. The switch unit SW12 is provided between the other output terminal of the differential amplification circuit 12 and the external output terminal PD2 and is controlled to be turned on or off according to the operation mode. The switch unit SW13 is provided on the feedback line of the node Ncm and is controlled to be turned on or off according to the operation mode.

The switch unit SW14 is provided between a power supply voltage terminal VDD to which the power supply voltage (VDD1 or VDD2) having a voltage level in accordance with the operation mode is supplied and a high-potential-side voltage terminal VH of the CMFB circuit 11 and the differential amplification circuit 12 and is controlled to be turned on or off according to the operation mode.

The mode controller 13 generates a control signal MD1 having a voltage level in accordance with the operation mode and outputs the control signal MD1 to the switch units SW1-SW3 and SW11-SW14, to thereby switch ON/OFF each of the switch units SW1-SW3 and SW11-SW14.

The operation mode is set, for example, from outside depending on the specification or set by a microcomputer on which the semiconductor device 1 is mounted. Further, while a case in which the mode controller 13 is provided inside the semiconductor device 1 is described in this embodiment, the present invention is not limited to this case and the mode controller 13 may be provided outside of the semiconductor device 1.

When the operation mode is the LVDS operation mode, for example, the switch units SW1 and SW2 are controlled to be turned on and the switch unit SW3 is controlled to be turned off. Accordingly, the external output terminal PD1 and the node Ncm are connected to each other via the resistance element R1 and the external output terminal PD2 and the node Ncm are connected to each other via the resistance element R2. Accordingly, the potential of the node Ncm shows the value obtained by dividing the potentials of the external output terminals PD1 and PD2 by the resistance elements R1 and R2. In other words, the node Ncm indicates the intermediate voltage Vcm between the external output terminals PD1 and PD2. In this case, the clamp voltage is not supplied to the node Ncm.

Further, when the operation mode is the LVDS operation mode, all the switch units SW11-SW14 are turned on. Accordingly, the CMFB circuit 11 and the differential amplification circuit 12 are supplied with the power supply voltage VDD1 and the CMFB circuit 11 and the differential amplification circuit 12 operate. In this case, the differential output signals Vo1 and Vo2 output from the differential amplification circuit 12 are respectively supplied to the external output terminals PD1 and PD2. The intermediate voltage Vcm between the external output terminals PD1 and PD2 generated in the node Ncm is fed back to the CMFB circuit 11.

On the other hand, when the operation mode is the CMOS operation mode, the switch units SW1 and SW2 are controlled to be turned off and the switch unit SW3 is controlled to be turned on. Accordingly, the connection between the external output terminal PD1 and the node Ncm and the connection between the external output terminal PD2 and the node Ncm are disconnected. Accordingly, the external output terminals PD1 and PD2 can be used independently from each other. Accordingly, the single end signals Vo3 and Vo4 output from the CMOS drivers DR1 and DR2 are respectively supplied to the external output terminals PD1 and PD2. Further, the clamp voltage is supplied to the node Ncm to avoid a floating state.

When the operation mode is the CMOS operation mode, all the switch units SW11-SW14 are turned off. Accordingly, the supply of the power supply voltage VDD1 to the CMFB circuit 11 and the differential amplification circuit 12 is interrupted. Further, the connection between the differential amplification circuit 12 and the external output terminals PD1 and PD2 and the connection between the CMFB circuit 11 and the node Ncm are disconnected. Therefore, the CMFB circuit 11 and the differential amplification circuit 12 completely stop the operations in the CMOS operation mode.

According to the aforementioned configuration, the semiconductor device 1 selectively outputs the low voltage differential signaling (LVDS) data signals or the single end signaling data signals from the common external output terminals PD1 and PD2. Regarding the semiconductor device 1, the number of external output terminals can be reduced, whereby it is possible to suppress an increase in the size of the circuit.

(Application Example of Semiconductor Device 1)

Figure 2:
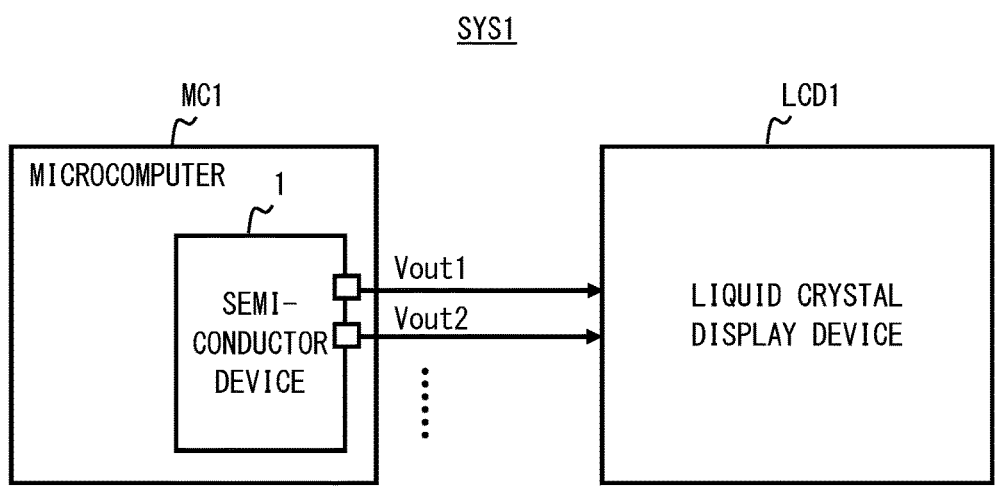
FIG. 2 is a block diagram showing a semiconductor system on which the semiconductor device shown in FIG. 1 is mounted.

FIG. 2 is a diagram showing a configuration example of a semiconductor system SYS1 on which the semiconductor device 1 is mounted.

As shown in FIG. 2, the semiconductor system SYS1 at least includes a microcomputer MC1 and a liquid crystal display device LCD1. In the example shown in FIG. 2, the semiconductor device 1 is mounted on the microcomputer MC1 and selectively outputs the low voltage differential signaling (LVDS) data signals or the single end signaling data signals from the external output terminals PD1 and PD2 according to the specification or the like to the liquid crystal display device LCD1. The liquid crystal display device LCD1 displays an image or the like in accordance with the data signals that have been received on a display screen.

(Specific Configuration Example of Differential Amplification Circuit 12 and CMFB Circuit 11)

Figure 3:
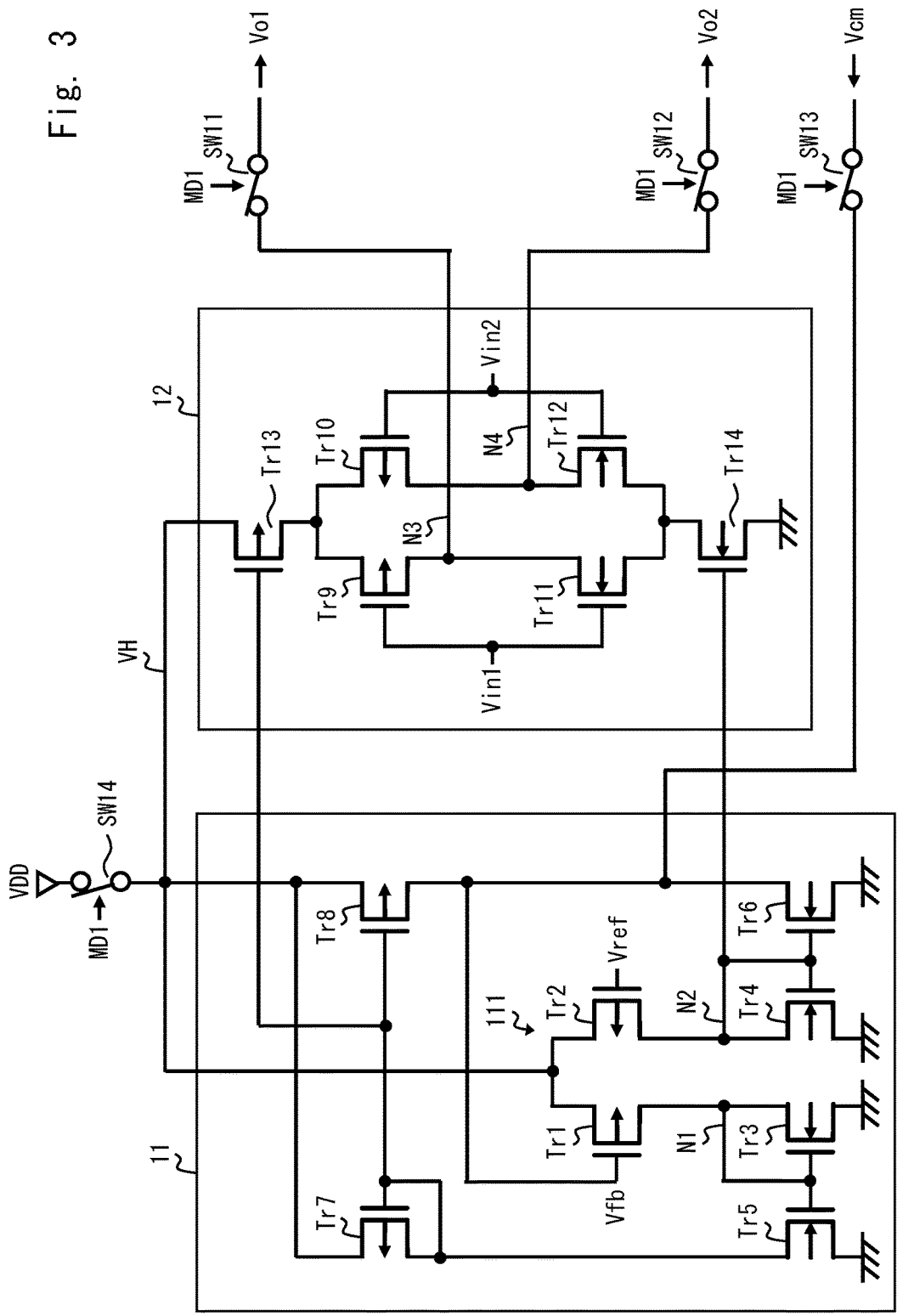
FIG. 3 is a circuit diagram showing a specific configuration example of a common feedback circuit and a differential amplification circuit provided in the semiconductor device shown in FIG. 1.

FIG. 3 is a circuit diagram showing a specific configuration example of the CMFB circuit 11 and the differential amplification circuit 12.

As shown in FIG. 3, the CMFB circuit 11 includes transistors Tr1-Tr8 and the differential amplification circuit 12 includes transistors Tr9-Tr14.

The transistors Tr1-Tr14 are each formed of, for example, a MOS transistor (low withstand voltage transistor) having a withstand voltage lower than the second power supply voltage VDD2 supplied as the power supply voltage in the CMOS operation mode in order to achieve a high-speed operation in the low voltage differential signal output mode.

In this embodiment, a case in which the transistors Tr1, Tr2, Tr7, Tr8, Tr9, Tr10, and Tr13 are P-channel MOS transistors and the transistors Tr3-Tr6, Tr11, Tr12, and Tr14 are N-channel MOS transistors will be described as an example.

((Specific Configuration Example of Differential Amplification Circuit 12))

In the differential amplification circuit 12 shown in FIG. 3, the transistors Tr9 and Tr11 form a first inverter and the transistors Tr10 and Tr12 form a second inverter. Further, the transistor Tr13 serves as a current source that controls a current flowing from the power supply voltage VDD1 to the first and second inverters. The transistor Tr14 serves as a current source that controls a current flowing from the first and second inverters to the ground voltage terminal GND.

The transistor Tr13 is provided between the high-potential-side voltage terminal VH of the differential amplification circuit 12 and high-potential-side voltage terminals (sources of the transistors Tr9 and Tr10) of the first and second inverters and the output voltage of the CMFB circuit 11 is applied to the gate of the transistor Tr13. The transistor Tr14 is provided between the ground voltage terminal GND and low-potential-side voltage terminals (sources of the transistors Tr11 and Tr12) of the first and second inverters and the output voltage of the CMFB circuit 11 is applied to the gate of the transistor Tr14. Accordingly, the current flowing through each of the transistors Tr13 and Tr14 is controlled by the output voltage of the CMFB circuit 11. The details of the output voltage of the CMFB circuit 11 will be described later.

The first inverter formed of the transistors Tr9 and Tr11 receives the input signal Vin1, which is one of the differential input signals, and outputs the output signal Vo1, which is one of the differential output signals. The second inverter formed of the transistors Tr10 and Tr12 receives the input signal Vin2, which is the other one of the differential input signals, and outputs the output signal Vo2, which is the other one of the differential output signals.

According to the above configuration, the differential amplification circuit 12 amplifies the differential input signals Vin1 and Vin2 and outputs the differential output signals Vo1 and Vo2.

((Specific Configuration Example of CMFB Circuit 11))

In the CMFB circuit 11 shown in FIG. 3, the transistors Tr1-Tr4 form a differential amplification circuit 111. The transistors Tr1 and Tr2 form an input stage of the differential amplification circuit 111 and the transistors Tr3 and Tr4 form an active load of the differential amplification circuit 111.

The transistor Tr1 is provided between the high-potential-side voltage terminal VH of the CMFB circuit 11 and an output node N1 of the differential amplification circuit 111 and the intermediate voltage Vcm (voltage of the node Ncm) between the external output terminals PD1 and PD2 is supplied to the gate of the transistor Tr1. The transistor Tr2 is provided between the high-potential-side voltage terminal VH of the CMFB circuit 11 and an output node N2 of the differential amplification circuit 111 and the reference voltage Vref, which is the target voltage of the common mode voltage, is supplied to the gate of the transistor Tr2.

The transistor Tr3 is provided between the ground voltage terminal GND and the output node N1. The gate of the transistor Tr3 is connected to the output node N1 and the gate of the transistor Tr5. Accordingly, a current proportional to the current flowing through the transistor Tr3 flows through the transistor Tr5. That is, the transistors Tr3 and Tr5 form a current mirror circuit.

The transistor Tr4 is provided between the ground voltage terminal GND and the output node N2. The gate of the transistor Tr4 is connected to the output node N2, the gate of the transistor Tr6, and the gate of the transistor Tr14 in the differential amplification circuit 12. Accordingly, a current proportional to the current flowing through the transistor Tr4 flows through each of the transistors Tr6 and Tr14. That is, the transistors Tr4 and Tr6 and the transistors Tr4 and Tr14 each form a current mirror circuit.

The transistor Tr7 is provided in series with the transistor Tr5 between the high-potential-side voltage terminal VH and the ground voltage terminal GND. The transistor Tr8 is provided in series with the transistor Tr6 between the high-potential-side voltage terminal VH and the ground voltage terminal GND. The intermediate voltage Vcm is supplied to a node between the transistors Tr8 and Tr6.

The gate of the transistor Tr7 is connected to the drain of the transistor Tr7, the gate of the transistor Tr8, and the gate of the transistor Tr13 in the differential amplification circuit 12. Therefore, a current proportional to the current flowing through the transistor Tr7 flows through the transistors Tr8 and Tr13. That is, the transistors Tr7 and Tr8 and the transistors Tr7 and Tr13 each form a current mirror circuit.

The CMFB circuit 11 applies the output voltage generated in accordance with the difference between the reference voltage Vref and the intermediate voltage Vcm to the respective gates of the transistors Tr13 and Tr14 in the differential amplification circuit 12, to thereby adjust the operating current of the differential amplification circuit 12. It is therefore possible to stabilize the center voltage (that is, the common mode voltage) of the differential output signals Vo1 and Vo2 output from the differential amplification circuit 12.

(Specific Configuration Example of Switch Units SW1-SW3)

Figure 4:
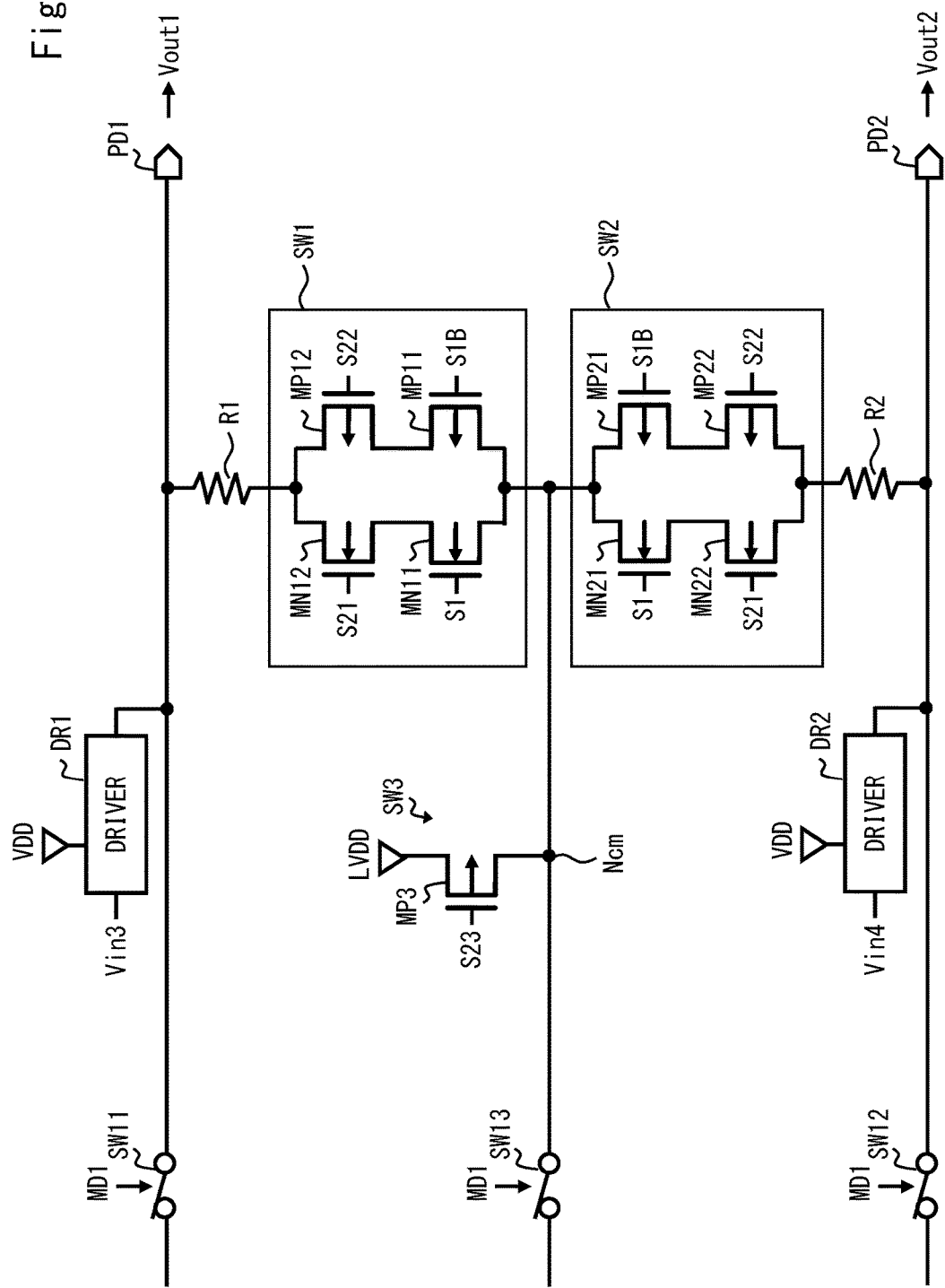
FIG. 4 is a circuit diagram showing a specific configuration example of switch units SW1-SW3 provided in the semiconductor device shown in FIG. 1.

FIG. 4 is a circuit diagram showing a specific configuration example of the switch units SW1-SW3.

As shown in FIG. 4, the switch unit SW1 includes transistors (a first switch transistor) MP11 and MN11 and transistors (a first voltage relaxation transistor) MP12 and MN12. The switch unit SW2 includes transistors (a second switch transistor) MP21 and MN21 and transistors (a second voltage relaxation transistor) MP22 and MN22. The switch unit SW3 includes a transistor MP3.

The transistors provided in the switch units SW1-SW3 are each formed of a MOS transistor (low withstand voltage transistor) having a withstand voltage lower than the second power supply voltage VDD2 supplied as the power supply voltage in the CMOS operation mode in order to achieve a high-speed operation in the LVDS operation mode.

In this embodiment, a case in which the transistors MP11, MP12, MP21, MP22, and MP3 are P-channel MOS transistors and the transistors MN11, MN12, MN21, and MN22 are N-channel MOS transistors will be described.

In the switch unit SW1, the transistors MN11 and MP11 are provided in parallel between the external output terminal PD1 and the node Ncm via the resistance element R1 and are controlled to be turned on or off by control signals S1 and S1B, each of the control signals S1 and S1B being a part of the control signal MD1. The control signals S1 and SIB both indicate a voltage level in a range between the power supply voltage (VDD1 or VDD2) to be supplied to the power supply voltage terminal VDD and the ground voltage GND. In the LVDS operation mode, for example, the first power supply voltage VDD1 is supplied to the power supply voltage terminal VDD and the control signals S1 and S1B indicate the voltage level in a range between the first power supply voltage VDD1 and the ground voltage GND (voltage amplitude). On the other hand, in the CMOS operation mode, the second power supply voltage VDD2 is supplied to the power supply voltage terminal VDD and the control signals S1 and S1B indicate the voltage level in a range between the second power supply voltage VDD2 and the ground voltage GND (voltage amplitude). Further, the control signal S1B is an inverting signal of the control signal S1.

Further, in the switch unit SW1, the transistor MN12 is provided between the external output terminal PD1 and the transistor MN11 and is controlled to be turned on or off by a control signal S21, which is a part of the control signal MD1. The transistor MP12 is provided between the external output terminal PD1 and the transistor MP11 and is controlled to be turned on or off by a control signal S22, which is a part of the control signal MD1. The control signals S21 and S22 both indicate the voltage level in a range between the first power supply voltage VDD1 and the ground voltage GND regardless of the operation mode.

In the switch unit SW2, the transistors MN21 and MP21 are provided in parallel between the external output terminal PD2 and the node Ncm via the resistance element R2 and are controlled to be turned on or off by the control signals S1 and S1B, each of the control signals S1 and SIB being a part of the control signal MD1.

Further, in the switch unit SW2, the transistor MN22 is provided between the external output terminal PD2 and the transistor MN21 and is controlled to be turned on or off by the control signal S21, which is a part of the control signal MD1. The transistor MP22 is provided between the external output terminal PD2 and the transistor MP21 and is controlled to be turned on or off by the control signal S22, which is a part of the control signal MD1.

In the switch unit SW3, the transistor MP3 has a source to which the first power supply voltage VDD1 is supplied, a gate to which a control signal S23, which is a part of the control signal MD1, is supplied, and a drain connected to the node Ncm. The control signal S23 indicates the voltage level in a range between the first power supply voltage VDD1 and the ground voltage GND.

(Voltage Application State in Each of Switch Units SW1-SW3)

Figure 5:
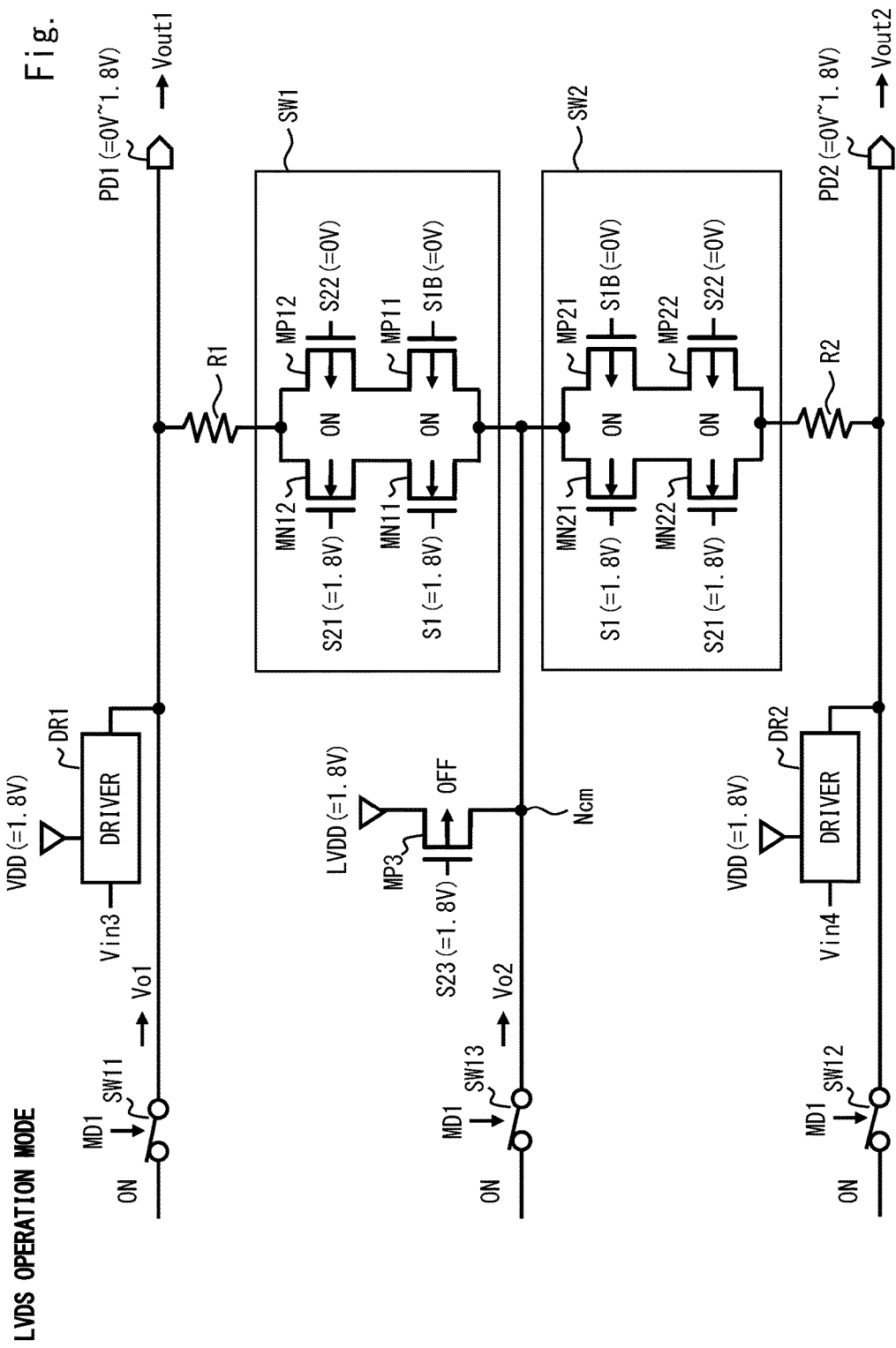
FIG. 5 is a diagram for describing a voltage application state in each of the switch units SW1-SW3 shown in FIG. 4 in an LVDS operation mode.
Figure 6:
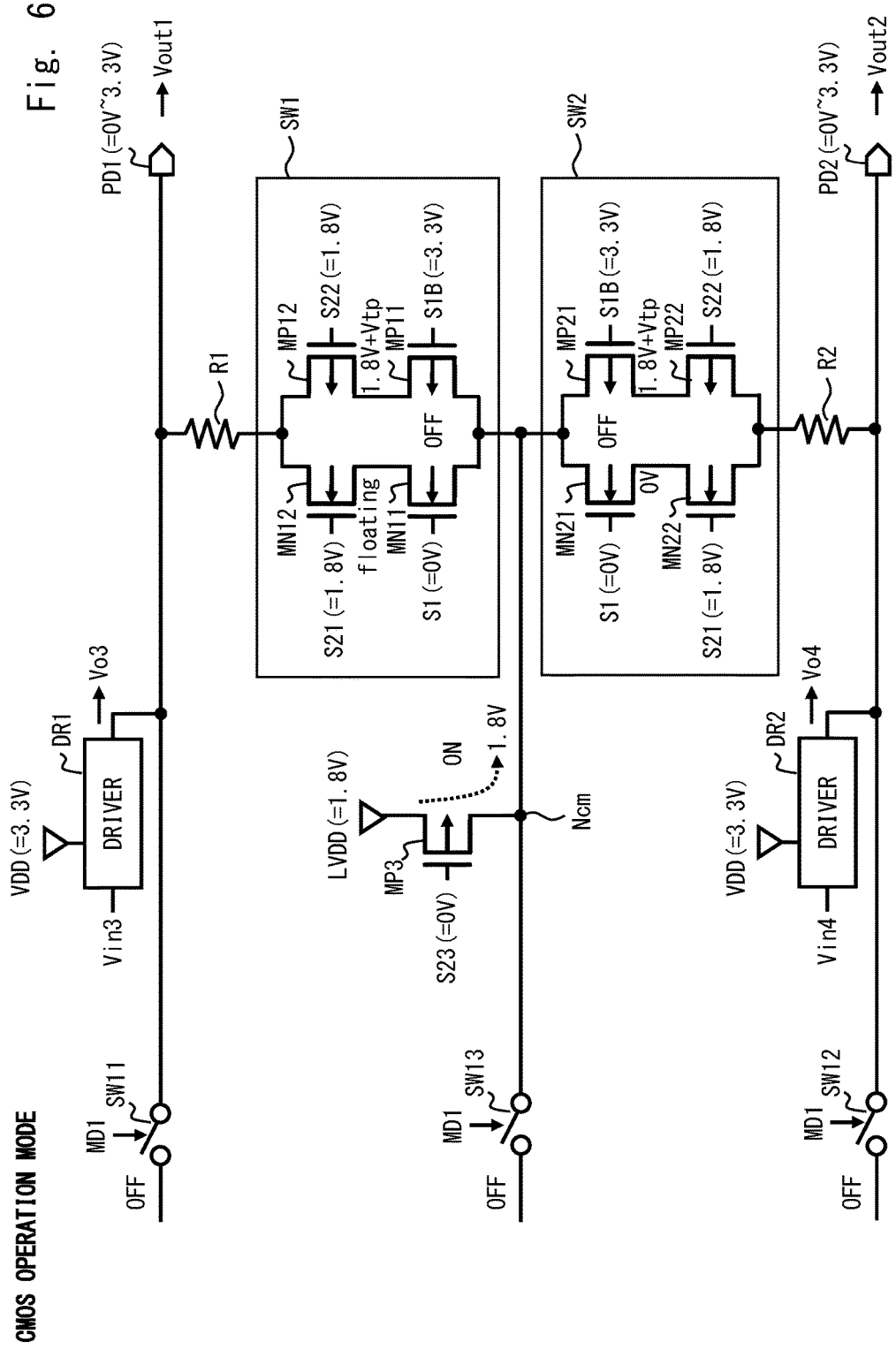
FIG. 6 is a diagram for describing a voltage application state in each of the switch units SW1-SW3 shown in FIG. 4 in a CMOS operation mode.

Next, a voltage application state in each of the switch units SW1-SW3 in each operation mode will be described. FIG. 5 is a diagram for describing a voltage application state in each of the switch units SW1-SW3 in the LVDS operation mode. FIG. 6 is a diagram for describing the voltage application state in each of the switch units SW1-SW3 in the CMOS operation mode.

In this embodiment, the power supply voltage (VDD1 or VDD2) to be supplied to the power supply voltage terminal VDD is switched depending on the operation mode. Specifically, in the LVDS operation mode, the first power supply voltage VDD1 (in this example, 1.8 V) is supplied to the power supply voltage terminal VDD and in the CMOS operation mode, the second power supply voltage VDD2 (in this example, 3.3 V) is supplied to the power supply voltage terminal VDD. On the other hand, the first power supply voltage VDD1 (in this example, 1.8 V) is constantly supplied to a power supply voltage terminal LVDD connected to the source of the transistor MP3 provided in the switch unit SW3 regardless of the operation mode.

First, as shown in FIG. 5, in the LVDS operation mode, the differential amplification circuit 12 amplifies the differential input signals Vin1 and Vin2 and outputs the differential output signals Vo1 and Vo2. Further, the CMFB circuit 11 adjusts the common mode voltage Vcm of the differential output signals Vo1 and Vo2 so that the common mode voltage Vcm matches the reference voltage Vref. The differential output signals Vo1 and Vo2 are respectively supplied to the external output terminals PD1 and PD2 and are output to outside as the differential output signals Vout1 and Vout2. The differential output signals Vout1 and Vout2 each indicate a voltage level having an amplitude of, for example, about 350 mV, in a range from 0 V to 1.8 V.

The control signal S1 having a voltage 1.8 V and the control signal S1B having a voltage 0 V are respectively applied to the gates of the transistors MN11 and MP11. The control signal S21 having a voltage 1.8V and the control signal S22 having a voltage 0 V are respectively applied to the gates of the transistors MN12 and MP12. Accordingly, all the transistors MN11, MP11, MN12, and MP12 are turned on.

The control signal S1 having a voltage 1.8 V and the control signal S1B having a voltage 0 V are respectively applied to the gates of the transistors MN21 and MP21. The control signal S21 having a voltage 1.8 V and the control signal S22 having a voltage 0 V are respectively applied to the gates of the transistors MN22 and MP22. Accordingly, all the transistors MN21, MP21, MN22, and MP22 are turned on.

The control signal S23 having a voltage 1.8 V is applied to the gate of the transistor MP3. Accordingly, the transistor MP3 is turned off since the gate-source voltage becomes smaller than a threshold voltage Vtp. That is, since the node Ncm is not in the floating state, the clamp voltage is not supplied to the node Ncm.

As shown in FIG. 5, in the LVDS operation mode, a voltage over the withstand voltage is not applied to any one of the switch units SW1-SW3.

Next, as shown in FIG. 6, in the CMOS operation mode, the CMOS drivers DR1 and DR2 respectively drive the single end signals Vin3 and Vin4 and output the single end signals Vo3 and Vo4. The single end signals Vo3 and Vo4 are respectively supplied to the external output terminals PD1 and PD2 and output to outside as the single end signals Vout1 and Vout2. The single end signals Vout1 and Vout2 each indicate a voltage level in a range from 0 V to 3.3 V. The example shown in FIG. 6 shows a case in which the single end signal Vout1 indicates the voltage level of 3.3 V and the single end signal Vout2 indicates the voltage level of 0 V.

The control signal S1 having a voltage 0 V and the control signal S1B having a voltage 3.3 V are respectively applied to the gates of the transistors MN11 and MP11. Accordingly, both of the transistors MN11 and MP11 are turned off. Further, the control signal S21 having a voltage 1.8 V and the control signal S22 having a voltage 1.8 V are respectively applied to the gates of the transistors MN12 and MP12. Accordingly, the transistors MN12 and MP12 are controlled to be turned on or off. When the potential of the external output terminal PD1 is 3.3 V, for example, the transistor MN12 is turned off since the gate-source voltage becomes smaller than a threshold voltage Vtn and the transistor MP12 is turned on since the gate-source voltage becomes equal to or larger than the threshold voltage Vtp.

The control signal S1 having a voltage 0 V and the control signal S1B having a voltage 3.3 V are respectively applied to the gates of the transistors MN21 and MP21. Accordingly, both of the transistors MN21 and MP21 are turned off. Further, the control signal S21 having a voltage 1.8 V and the control signal S22 having a voltage 1.8 V are respectively applied to the gates of the transistors MN22 and MP22. Accordingly, the transistors MN22 and MP22 are each controlled to be turned on or off. When the potential of the external output terminal PD2 is 0 V, for example, the transistor MN22 is turned on since the gate-source voltage becomes equal to or larger than the threshold voltage Vtn and the transistor MP22 is turned off since the gate-source voltage becomes smaller than the threshold voltage Vtp.

The control signal S23 having a voltage 0 V is applied to the gate of the transistor MP3. Accordingly, the transistor MP3 is turned on since the gate-source voltage becomes equal to or larger than the threshold voltage Vtp. As a result, a clamp voltage having a voltage 1.8 V is supplied to the node Ncm, which has been in the floating state.

Figure 22:
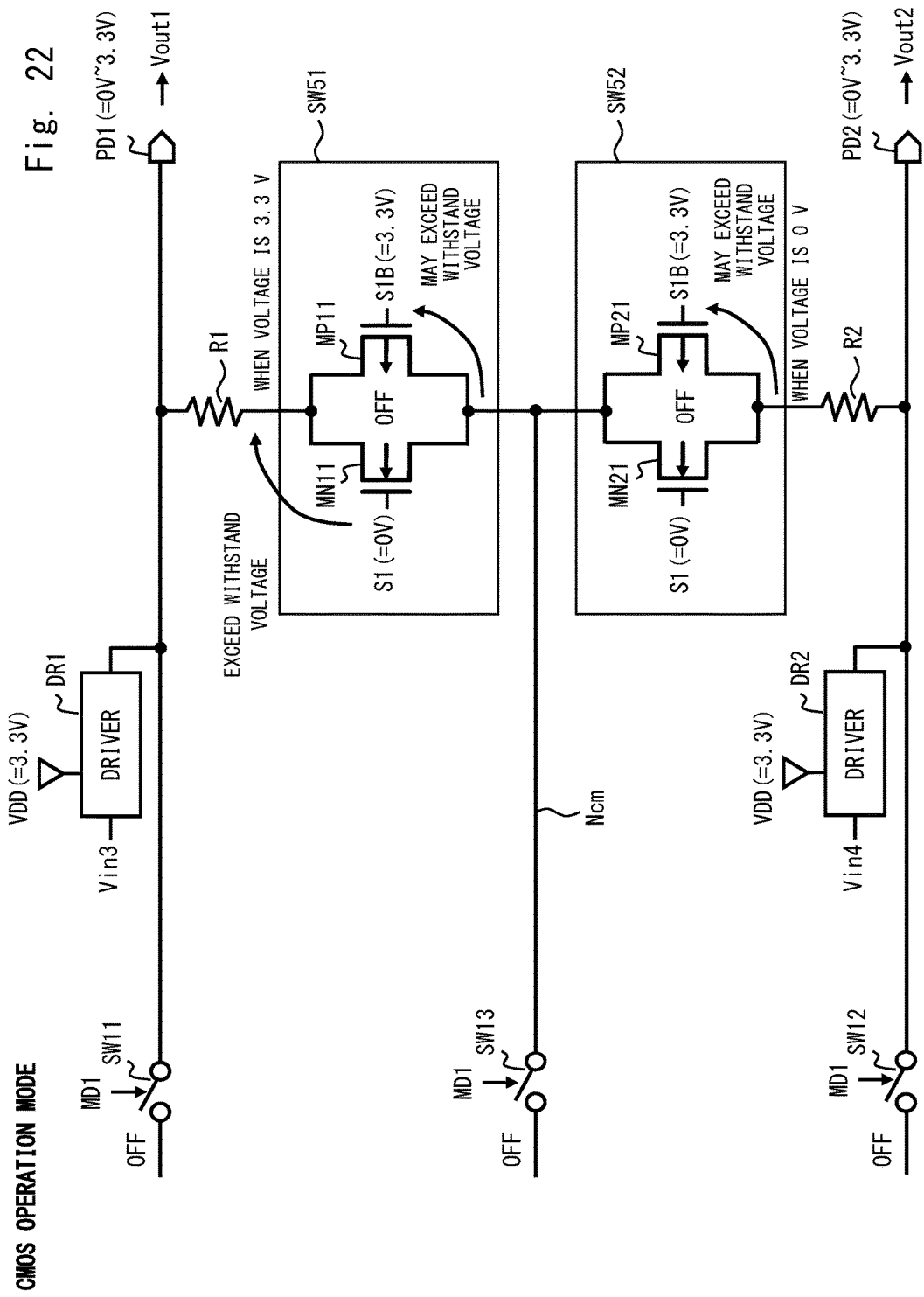
FIG. 22 is a diagram for describing a voltage application state in each of switch units SW51 and SW52 provided in a semiconductor device according to a comparative example in an CMOS operation mode.

If the transistors MN12 and MP12 are not provided in the switch unit SW1, as shown in a comparative example shown in FIG. 22, the gate-source voltage (3.3 V) of the transistor MN11 exceeds the withstand voltage (2.5 V). Further, if the transistors MN22 and MP22 are not provided in the switch unit SW2, the gate-source voltage (3.3 V) of the transistor MP21 exceeds the withstand voltage (2.5 V). Further, if the switch unit SW3 is not provided, the state of the node Ncm becomes a floating state. Accordingly, when the voltage in the node Ncm which is in the floating state becomes equal to or lower than 0.8 V, the gate-source voltage of the transistor MP11 may exceed the withstand voltage (2.5 V).

On the other hand, in the example shown in FIG. 6, the voltage relaxation transistors MN12 and MP12 are provided in the switch unit SW1 and the voltage relaxation transistors MN22 and MP22 are provided in the switch unit SW2. Further, the switch unit SW3 to supply the clamp voltage (that exceeds, for example, 0.8 V) to the node Ncm which is in the floating state is provided. Therefore, a voltage over the withstand voltage is not applied to any one of the switch units SW1-SW3 even in the CMOS operation mode.

In the example shown in FIG. 6, the node between the transistors MN11 and MN12 (this node will be called a node Nx) is in the floating state. However, while, besides the transistor MN12, the resistance element R1 is provided between the node Nx and the external output terminal PD1, only the transistor MN11 is provided between the node Nx and the node Ncm. Therefore, the leakage current tends to flow out to the side of the transistor MN11. Therefore, the potential of the node Nx between the transistors MN11 and MN12 is stably maintained at around the potential of the node Ncm. Accordingly, the floating state of the node Nx does not cause application of a voltage over the withstand voltage to any one of the transistors MN11 and MN12.

As described above, the semiconductor device 1 according to this embodiment selectively outputs the low voltage differential signaling (LVDS) data signals or the single end signaling data signals from the external output terminals PD1 and PD2 depending on the specification or the like. Accordingly, the semiconductor device 1 is able to reduce the number of external output terminals, whereby it is possible to suppress the increase in the size of the circuit.

Further, the semiconductor device 1 according to this embodiment further includes, as the components of the switch units SW1 and SW2, besides transistors for switching, transistors for voltage relaxation. Further, the semiconductor device 1 according to this embodiment further includes a transistor to supply the clamp voltage to the feedback line (node Ncm) which indicates the floating state in the CMOS operation mode. The semiconductor device 1 is therefore able to prevent breakdown of the transistors that form the switch units SW1-SW3.

In this embodiment, the case in which the switch unit SW1 is provided between the resistance element R1 and the node Ncm and the switch unit SW2 is provided between the resistance element R2 and the node Ncm has been described. However, the present invention is not limited to this case. The switch unit SW1 may be provided between the resistance element R1 and the external output terminal PD1. The switch unit SW2 may be provided between the resistance element R2 and the external output terminal PD2.

Further, while the case in which the supply of the power supply voltage VDD1 to the CMFB circuit 11 and the differential amplification circuit 12 is stopped in the CMOS operation mode by providing the switch units SW11-SW14 has been described as an example in this embodiment, the present invention is not limited to this case. By fixing the inputs of the differential input signals Vin1 and Vin2, for example, the CMFB circuit 11 and the differential amplification circuit 12 may be controlled so that these circuits do not substantially operate. In this case, the switch units SW11-SW14 are not necessary. Hereinafter, this case will be simply described.

(Modified Example of Semiconductor Device 1)

Figure 7:
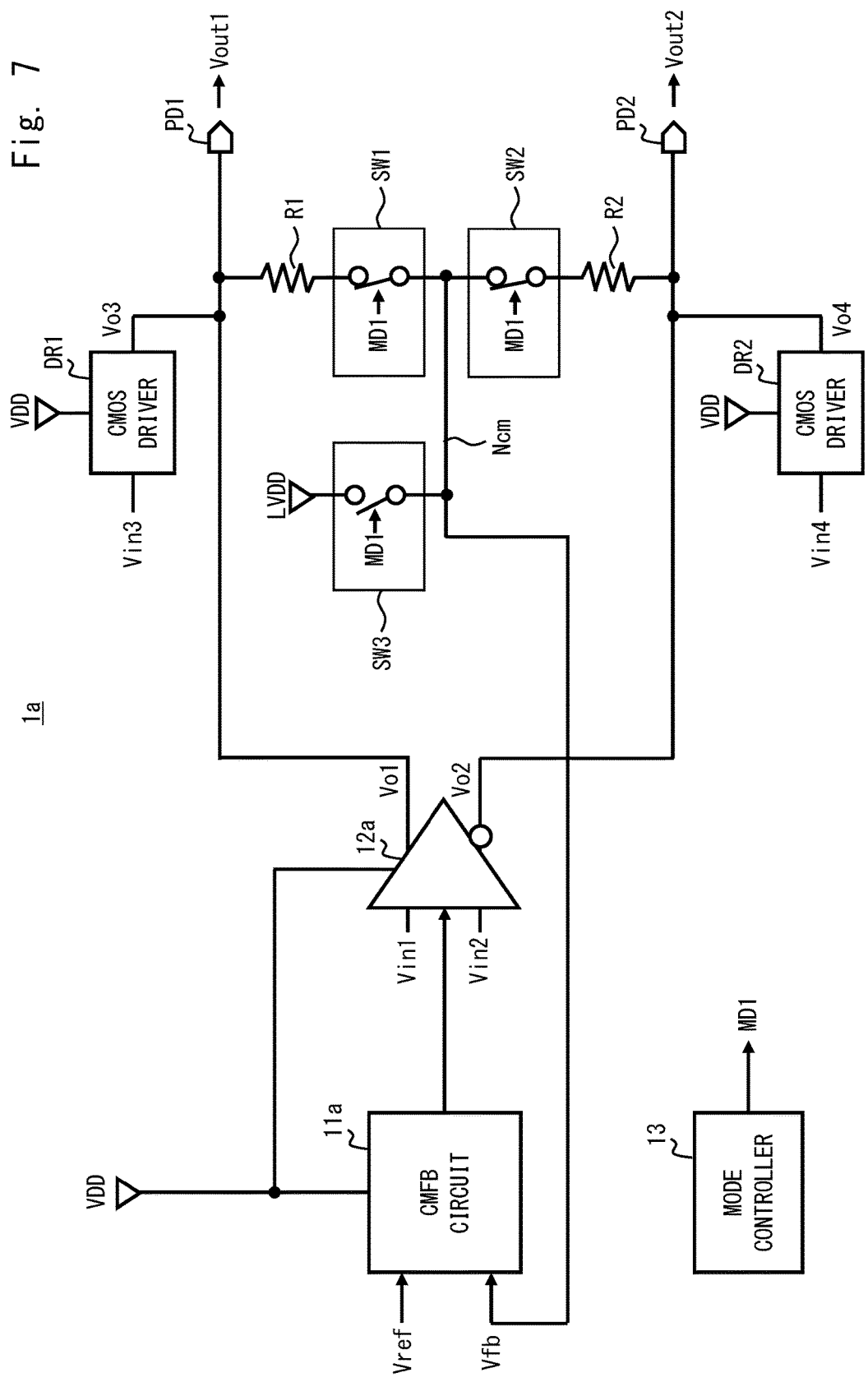
FIG. 7 is a block diagram showing a modified example of the semiconductor device shown in FIG. 1.

FIG. 7 is a diagram showing a semiconductor device 1a, which is a modified example of the semiconductor device 1.

As shown in FIG. 7, the semiconductor device 1a is different from the semiconductor device 1 in that the semiconductor device 1a includes a CMFB circuit 11a and a differential amplification circuit 12a in place of the CMFB circuit 11 and the differential amplification circuit 12 provided in the semiconductor device 1 and does not include the switch units SW11-SW14 provided in the semiconductor device 1. Since the other configurations of the semiconductor device 1a are similar to those of the semiconductor device 1, the descriptions thereof will be omitted.

Since the semiconductor device 1a does not include the switch units SW11-SW14, 3.3 V, which is a high voltage, is supplied to the CMFB circuit 11a and the differential amplification circuit 12a, each of which being formed using a low withstand voltage transistor, in the CMOS operation mode. Accordingly, transistors for voltage relaxation are added to each of the CMFB circuit 11a and the differential amplification circuit 12a in order to prevent breakdown.

Figure 8:
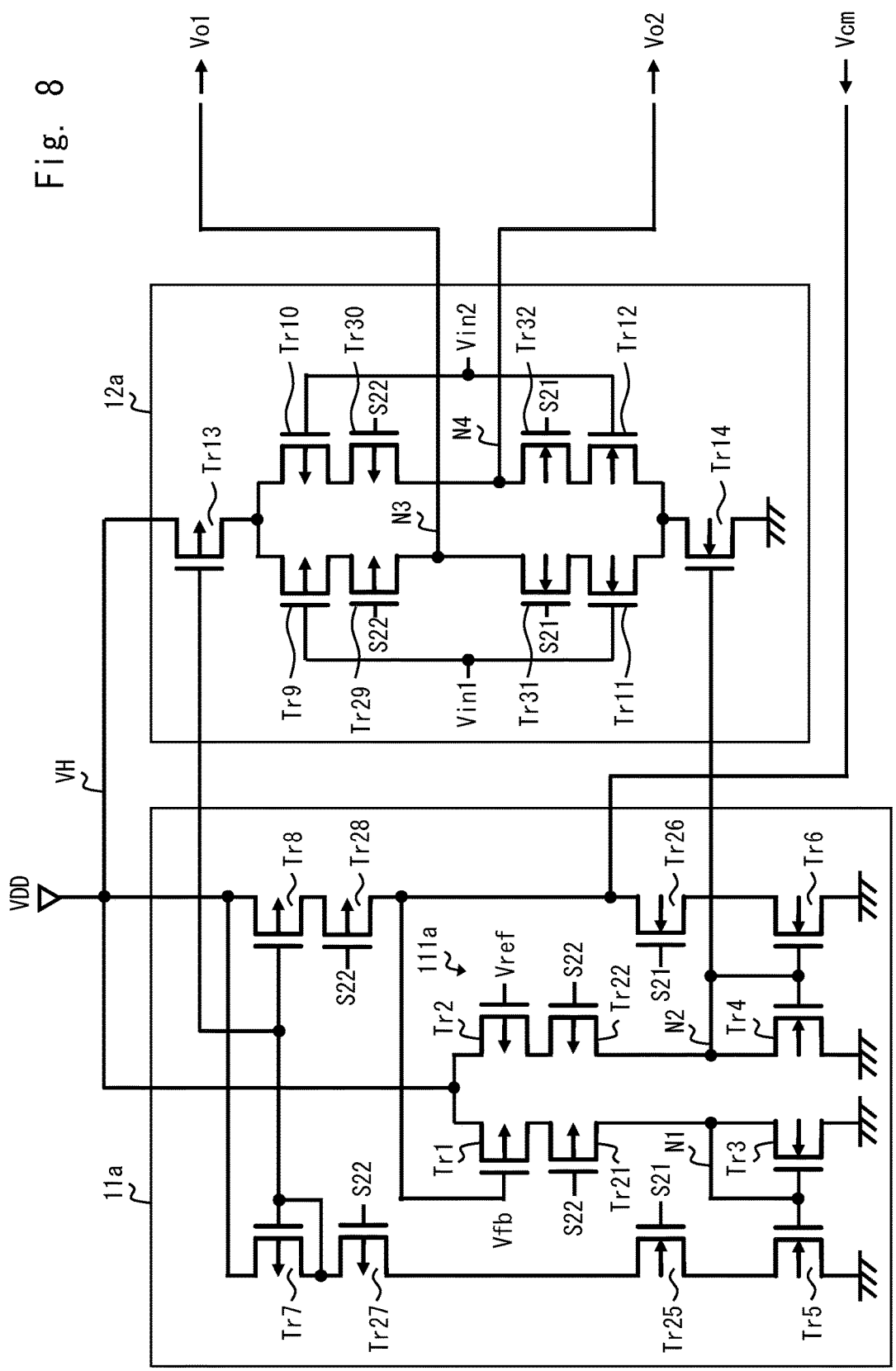
FIG. 8 is a circuit diagram showing a specific configuration example of the common feedback circuit and the differential amplification circuit provided in the semiconductor device shown in FIG. 7.

FIG. 8 is a diagram showing a specific configuration example of the CMFB circuit 11a and the differential amplification circuit 12a.

As shown in FIG. 8, the CMFB circuit 11a further includes transistors Tr21, Tr22, and Tr25-Tr28.

Specifically, the transistors Tr21, Tr22, and Tr25-Tr28 are cascade connected to the transistors Tr1, Tr2, and Tr5-Tr8. Further, the control signal S22 is applied to the respective gates of the transistors Tr21 and Tr22, the control signal S21 is applied to the respective gates of the transistors Tr25 and Tr26, and the control signal S22 is applied to the respective gates of the transistors Tr27 and Tr28. Since the other configurations of the CMFB circuit 11a are similar to those of the CMFB circuit 11, the descriptions thereof will be omitted.

Further, as shown in FIG. 8, the differential amplification circuit 12a further includes transistors Tr29-Tr32.

Specifically, the transistors Tr29-Tr32 are respectively cascade connected to the transistors Tr9-Tr12. Further, the control signal S22 is applied to the respective gates of the transistors Tr29 and Tr30 and the control signal S21 is applied to the respective gates of the transistors Tr31 and Tr32. Since the other configurations of the differential amplification circuit 12a are similar to those of the differential amplification circuit 12, the descriptions thereof will be omitted.

According to the aforementioned configuration, the semiconductor device 1a helps to prevent breakdown of the transistors that form the CMFB circuit 11a and the differential amplification circuit 12a in the CMOS operation mode even when the switch units SW11-SW14 are not included in the semiconductor device 1a.

(Modified Examples of Switch Unit SW3)

Further, while the case in which the P-channel MOS transistor MP3 is provided in the switch unit SW3 has been described in this embodiment, the present invention is not limited to this example. In the following description, some modified examples of the switch unit SW3 will be described.

((First Modified Example of Switch Unit SW3))

Figure 9:
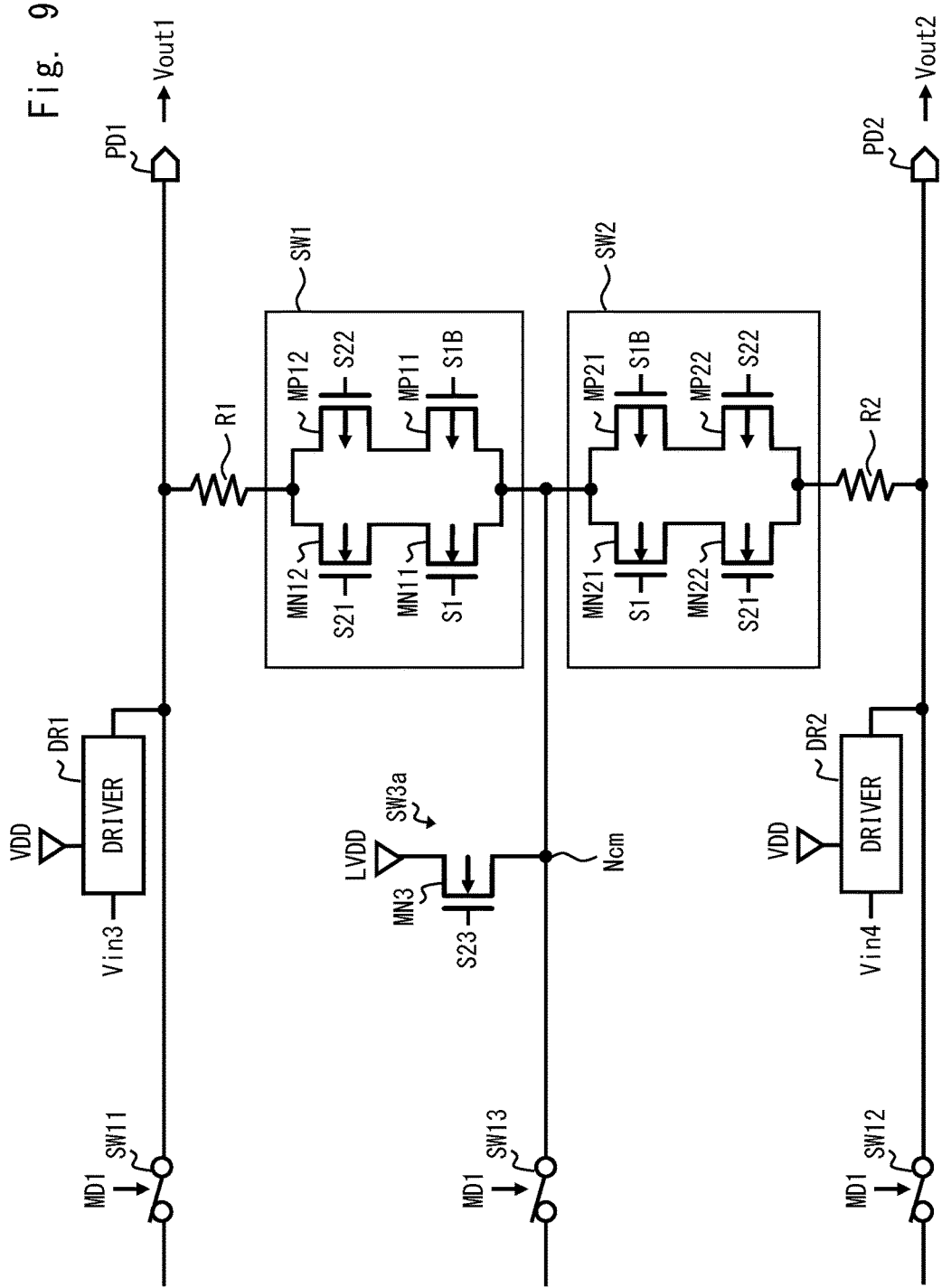
FIG. 9 is a diagram showing a first modified example of the switch unit SW3 provided in the semiconductor device shown in FIG. 1.

FIG. 9 is a diagram showing a switch unit SW3a, which is a first modified example of the switch unit SW3. FIG. 9 also shows the switch units SW1 and SW2 and peripheral circuits thereof.

As shown in FIG. 9, the switch unit SW3a includes an N-channel MOS transistor (hereinafter it will be simply referred to as a transistor) MN3. The transistor MN3 has a drain to which the first power supply voltage VDD1 is supplied, a gate to which the control signal S23, which is a part of the control signal MD1, is supplied, and a source connected to the node Ncm. The control signal S23 indicates a voltage level in a range between the first power supply voltage VDD1 and the ground voltage GND.

Figure 10:
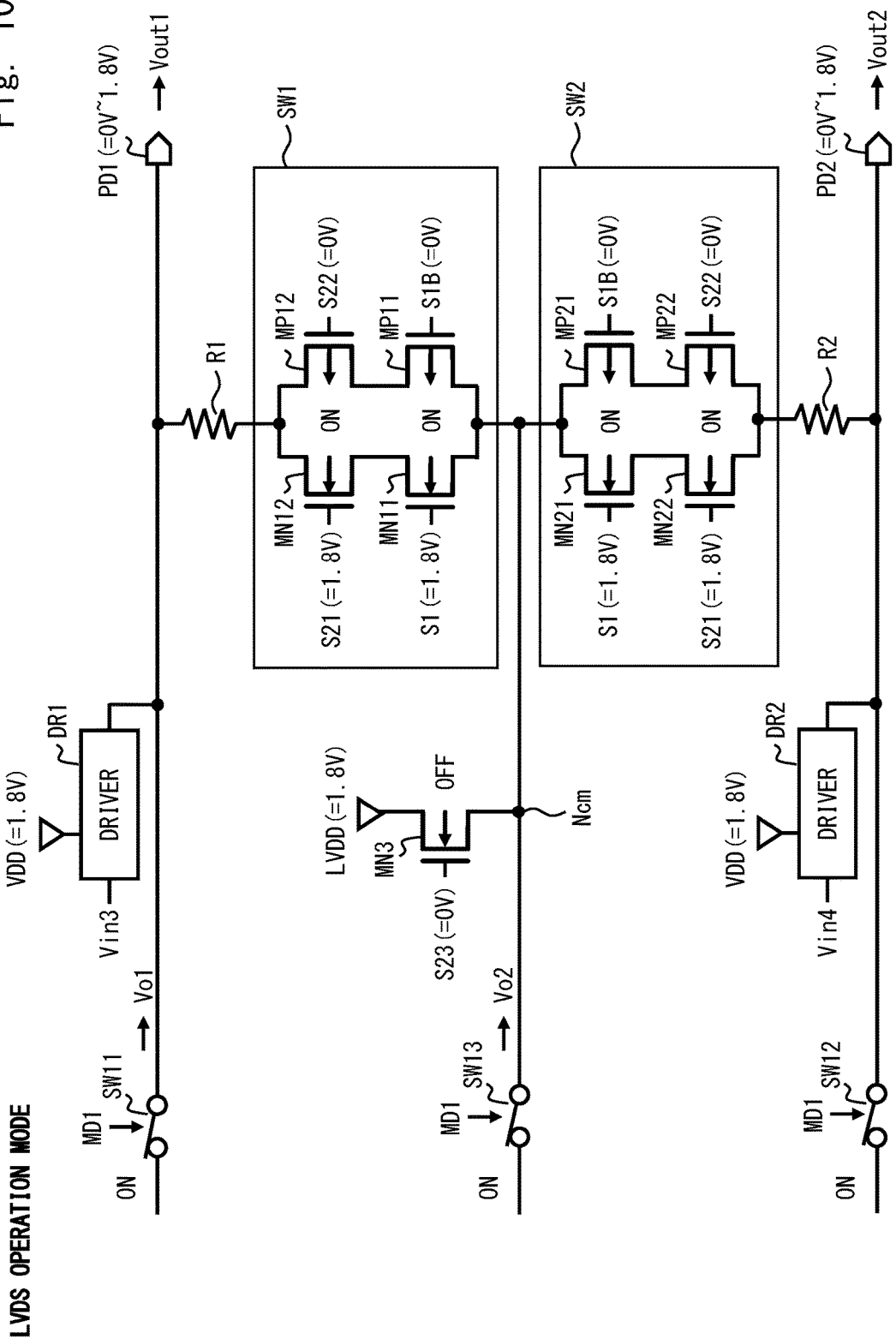
FIG. 10 is a diagram for describing a voltage application state in each of the switch units SW1-SW3 shown in FIG. 9 in the LVDS operation mode.

FIG. 10 is a diagram for describing a voltage application state in each of the switch units SW1, SW2, and SW3a in the LVDS operation mode. As shown in FIG. 10, in the LVDS operation mode, the control signal S23 having a voltage 0 V is applied to the gate of the transistor MN3. Accordingly, the transistor MN3 is turned off since the gate-source voltage becomes smaller than the threshold voltage Vtn. That is, since the node Ncm is not in the floating state, the clamp voltage is not supplied to the node Ncm.

Figure 11:
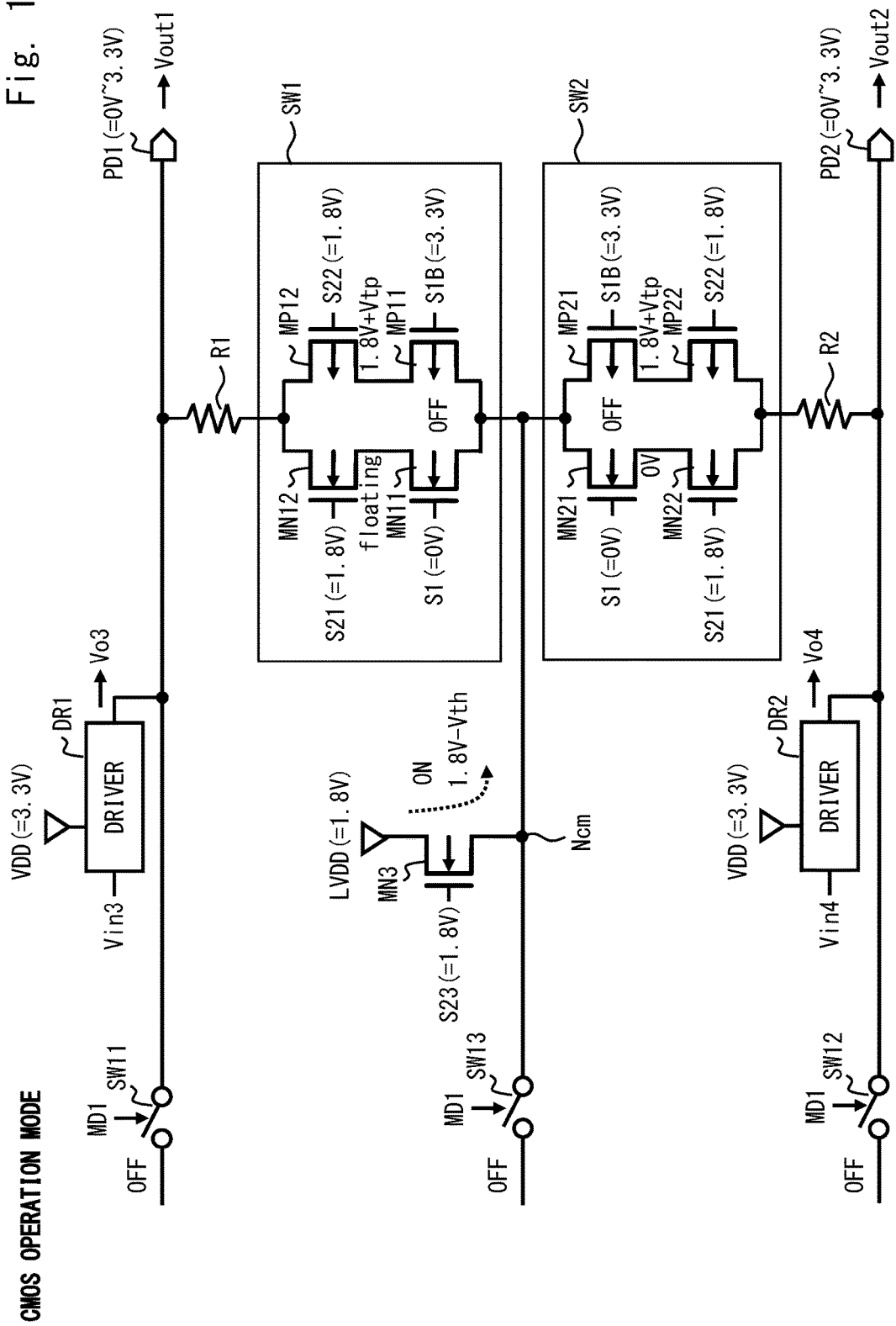
FIG. 11 is a diagram for describing a voltage application state in each of the switch units SW1-SW3 shown in FIG. 9 in the CMOS operation mode.

FIG. 11 is a diagram for describing a voltage application state in each of the switch units SW1, SW2, and SW3a in the CMOS operation mode. As shown in FIG. 11, in the CMOS operation mode, the control signal S23 having the voltage 1.8 V is applied to the gate of the transistor MN3. Accordingly, the transistor MN3 is turned on since the gate-source voltage becomes equal to or larger than the threshold voltage Vtn. As a result, the clamp voltage having a voltage 1.8 V-Vtn is supplied to the node Ncm which has been in the floating state.

As described above, the semiconductor device 1 is able to bring about effects substantially equal to those when the embodiment is not modified even when the switch unit SW3a is used as the modified example of the switch unit SW3.

((Second Modified Example of Switch Unit SW3))

Figure 12:
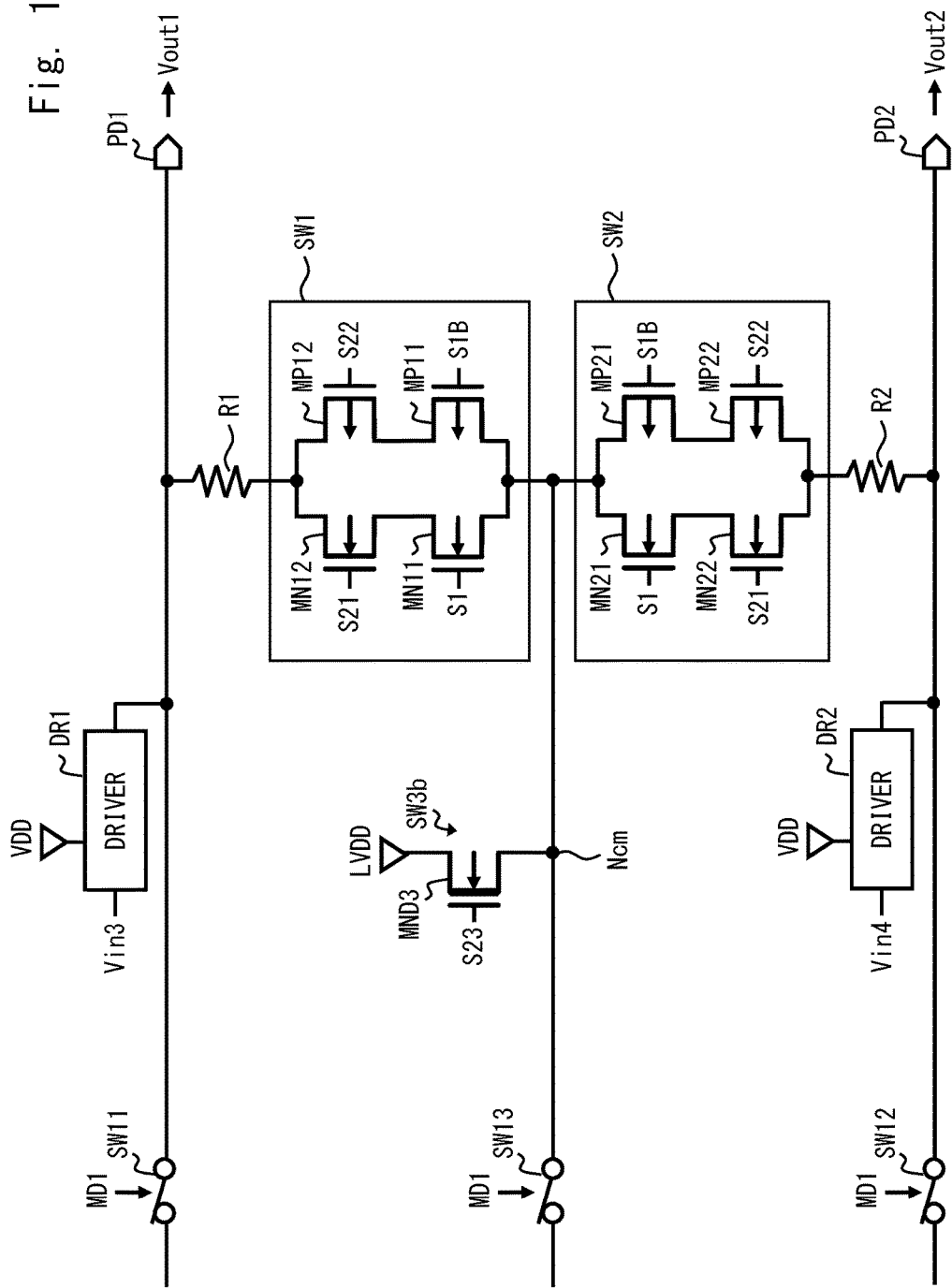
FIG. 12 is a diagram showing a second modified example of the switch unit SW3 provided in the semiconductor device shown in FIG. 1.

FIG. 12 is a diagram showing a switch unit SW3b, which is a second modified example of the switch unit SW3. FIG. 12 also shows the switch units SW1 and SW2 and peripheral circuits thereof.

As shown in FIG. 12, the switch unit SW3b includes a depletion-type N-channel MOS transistor (hereinafter it will be simply referred to as a transistor) MND3. The transistor MND3 has a drain to which the first power supply voltage VDD1 is supplied, a gate to which the control signal S23, which is a part of the control signal MD1, is supplied, and a source connected to the node Ncm. The control signal S23 indicates a voltage level in a range between the first power supply voltage VDD1 and the ground voltage GND.

Figure 13:
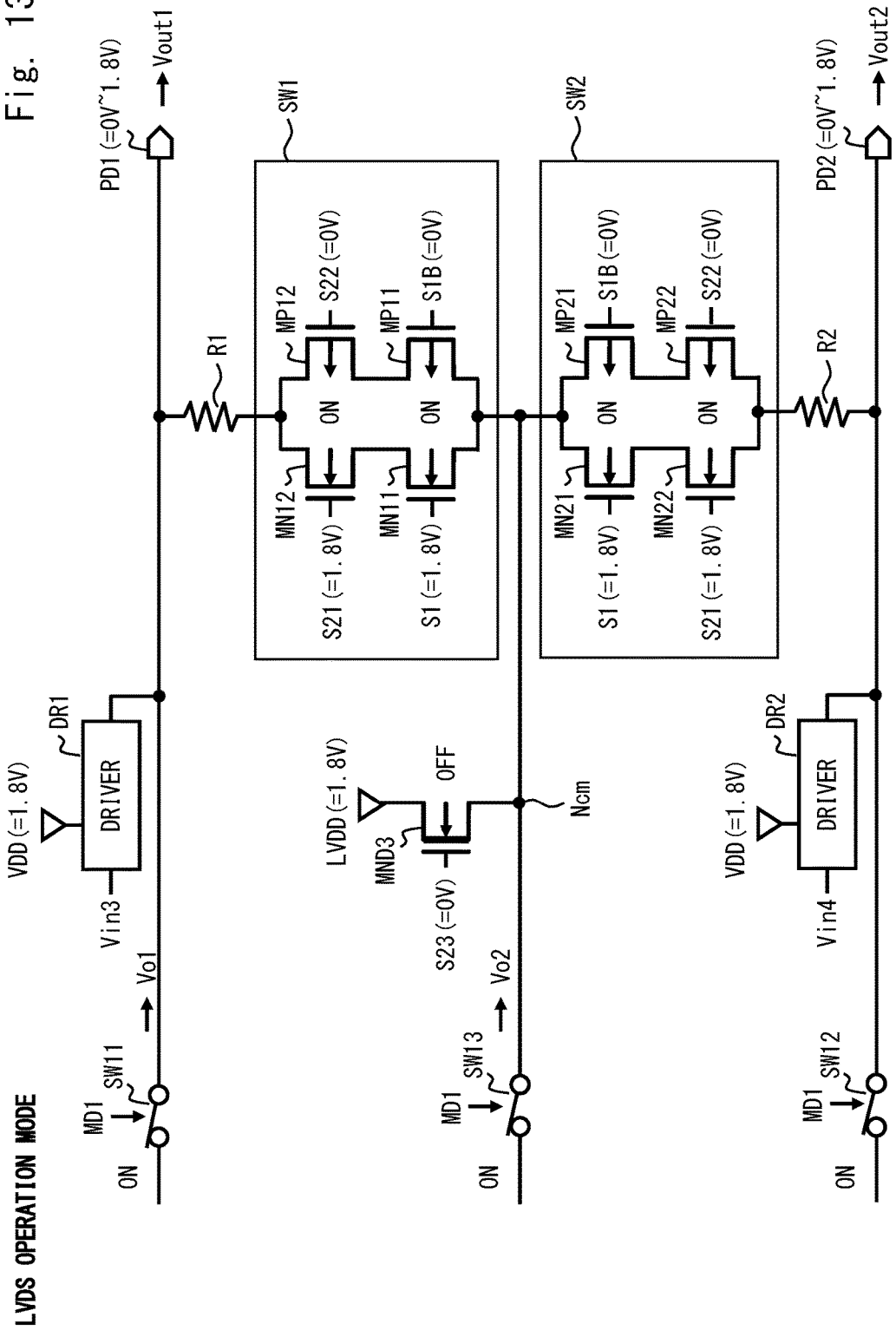
FIG. 13 is a diagram for describing a voltage application state in each of the switch units SW1-SW3 shown in FIG. 12 in the LVDS operation mode.

FIG. 13 is a diagram for describing a voltage application state in each of the switch units SW1, SW2, and SW3b in the LVDS operation mode. As shown in FIG. 13, in the LVDS operation mode, the control signal S23 having a voltage 0 V is applied to the transistor MND3. Accordingly, the transistor MND3 is turned off since the gate-source voltage becomes smaller than the threshold voltage. That is, since the node Ncm is not in the floating state, the clamp voltage is not supplied to the node Ncm.

Figure 14:
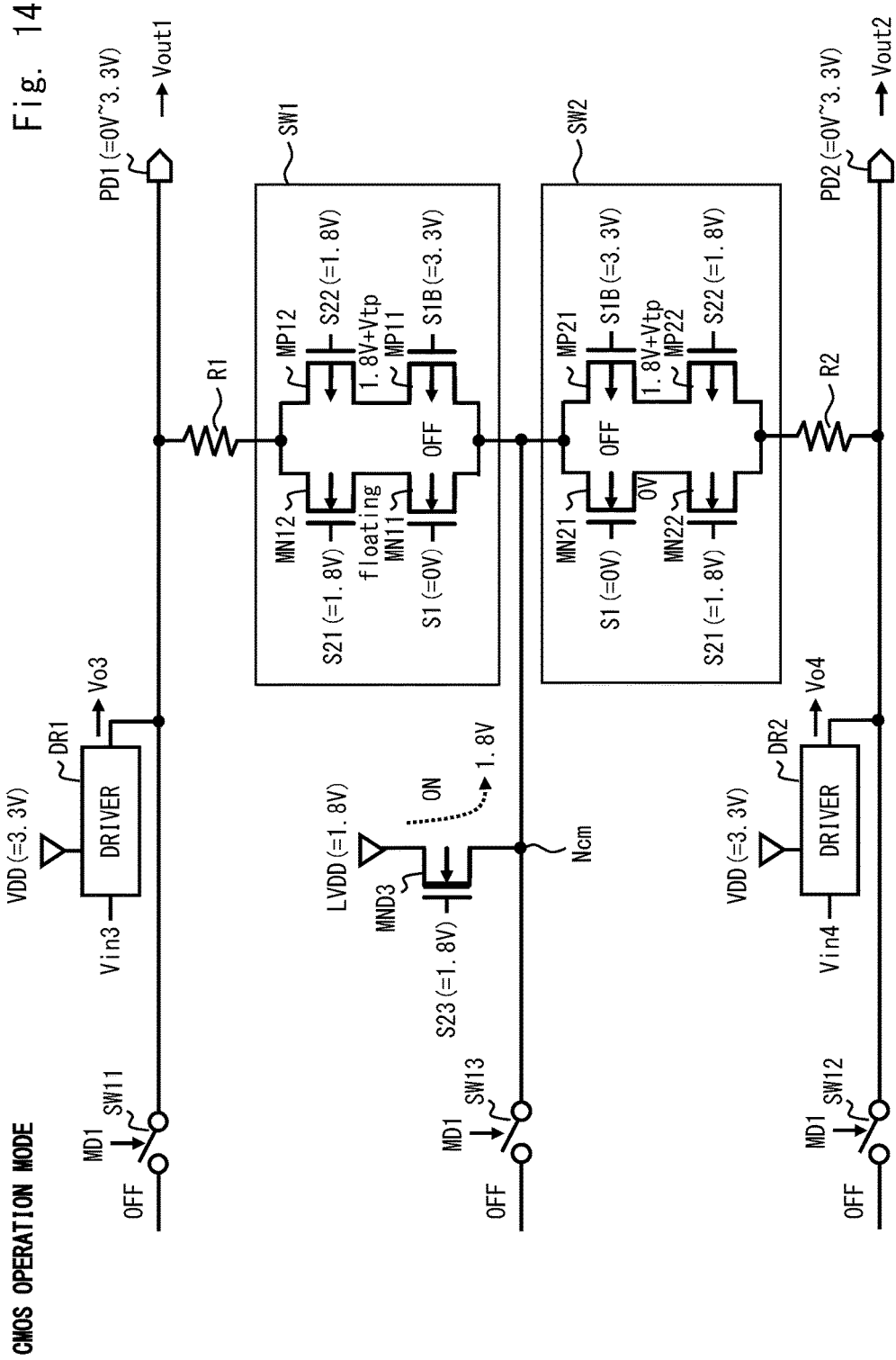
FIG. 14 is a diagram for describing a voltage application state in each of the switch units SW1-SW3 shown in FIG. 12 in the CMOS operation mode.

FIG. 14 is a diagram for describing a voltage application state in each of the switch units SW1, SW2, and SW3b in the CMOS operation mode. As shown in FIG. 14, in the CMOS operation mode, the control signal S23 having the voltage 1.8 V is applied to the gate of the transistor MND3. Accordingly, the transistor MND3 is turned on since the gate-source voltage becomes equal to or larger than the threshold voltage. As a result, the clamp voltage having the voltage 1.8 V is supplied to the node Ncm which has been in the floating state.

As described above, the semiconductor device 1 is able to bring about effects substantially equal to those when the embodiment is not modified even when the switch unit SW3b is used as the modified example of the switch unit SW3.

((Third Modified Example of Switch Unit SW3))

Figure 15:
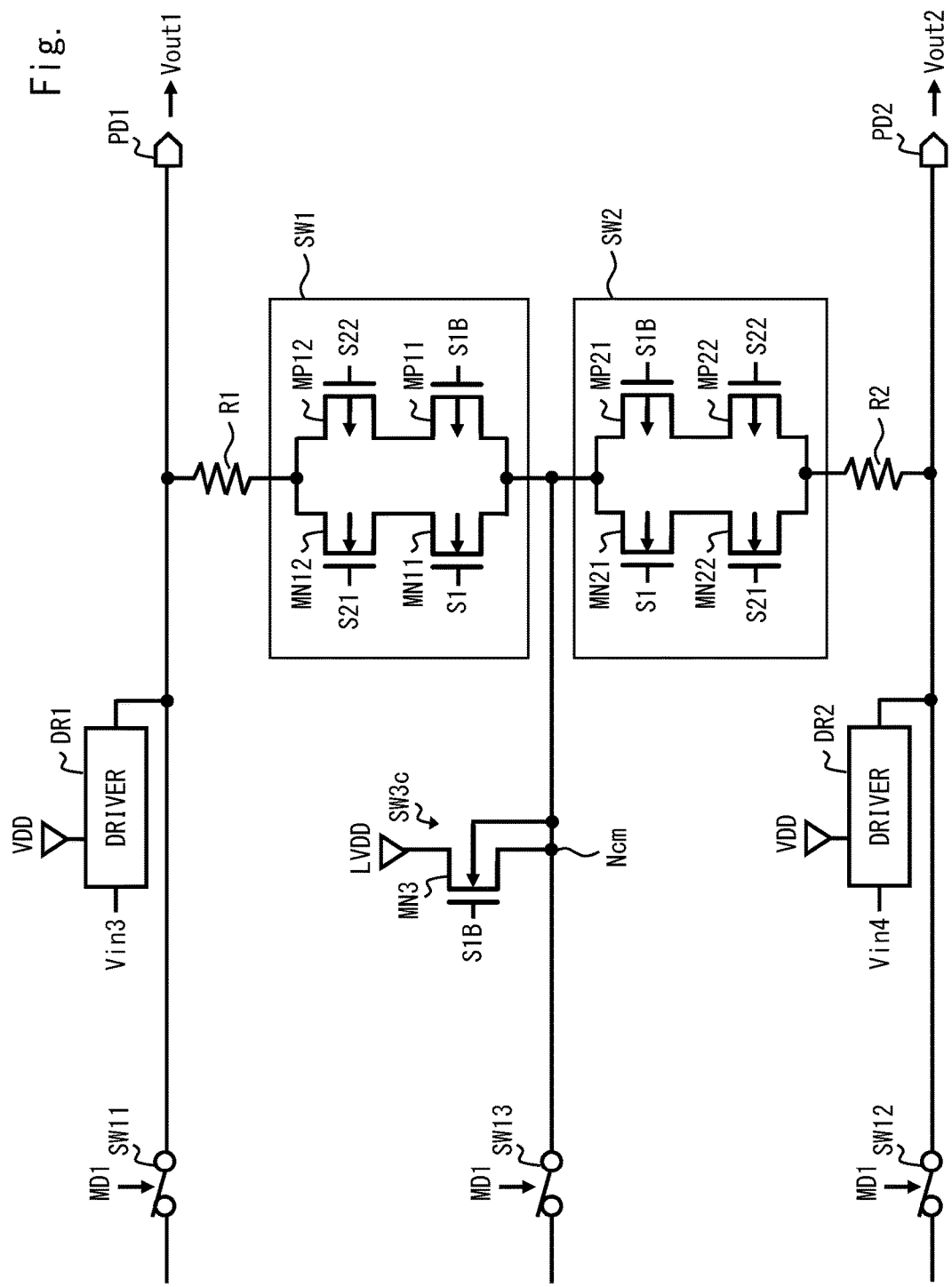
FIG. 15 is a diagram showing a third modified example of the switch unit SW3 provided in the semiconductor device shown in FIG. 1.

FIG. 15 is a diagram showing a switch unit SW3c, which is a third modified example of the switch unit SW3. FIG. 15 also shows the switch units SW1 and SW2 and peripheral circuits thereof.

As shown in FIG. 15, the switch unit SW3c includes an N-channel MOS transistor (hereinafter it will be simply referred to as a transistor) MN3. The transistor MN3 has a drain to which the first power supply voltage VDD1 is supplied, a gate to which the control signal S1B, which is a part of the control signal MD1, is supplied, and a source and a back gate connected to the node Ncm. The control signal S1B indicates a voltage level in a range between the power supply voltage (VDD1 or VDD2) to be supplied to the power supply voltage terminal VDD and the ground voltage GND.

Figure 16:
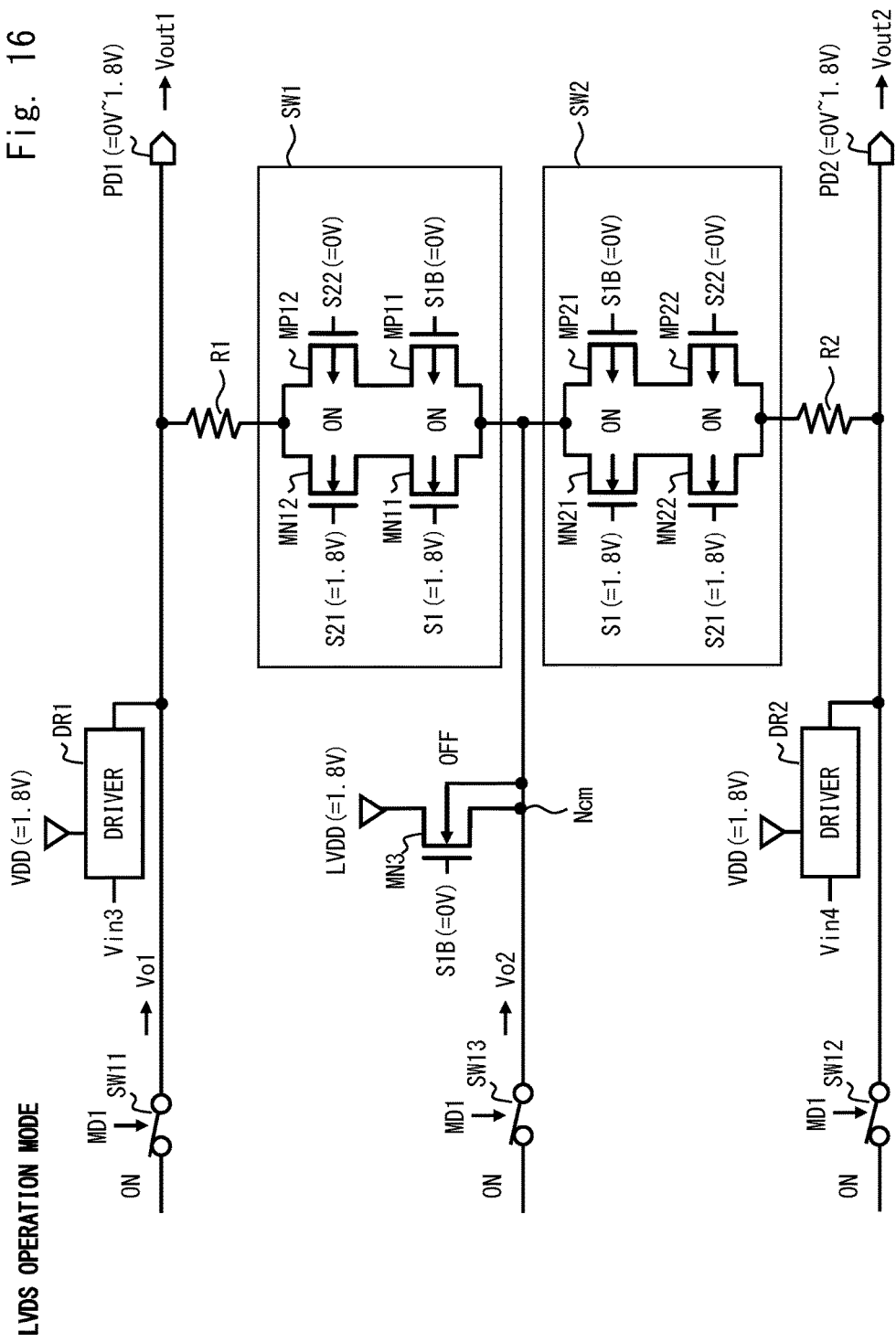
FIG. 16 is a diagram for describing a voltage application state in each of the switch units SW1-SW3 shown in FIG. 15 in the LVDS operation mode.

FIG. 16 is a diagram for describing a voltage application state in each of the switch units SW1, SW2, and SW3c in the LVDS operation mode. As shown in FIG. 16, in the LVDS operation mode, the control signal S1B having a voltage 0 V is applied to the gate of the transistor MN3. Accordingly, the transistor MN3 is turned off since the gate-source voltage becomes smaller than the threshold voltage. That is, since the node Ncm is in the floating state, the clamp voltage is not supplied to the node Ncm.

Figure 17:
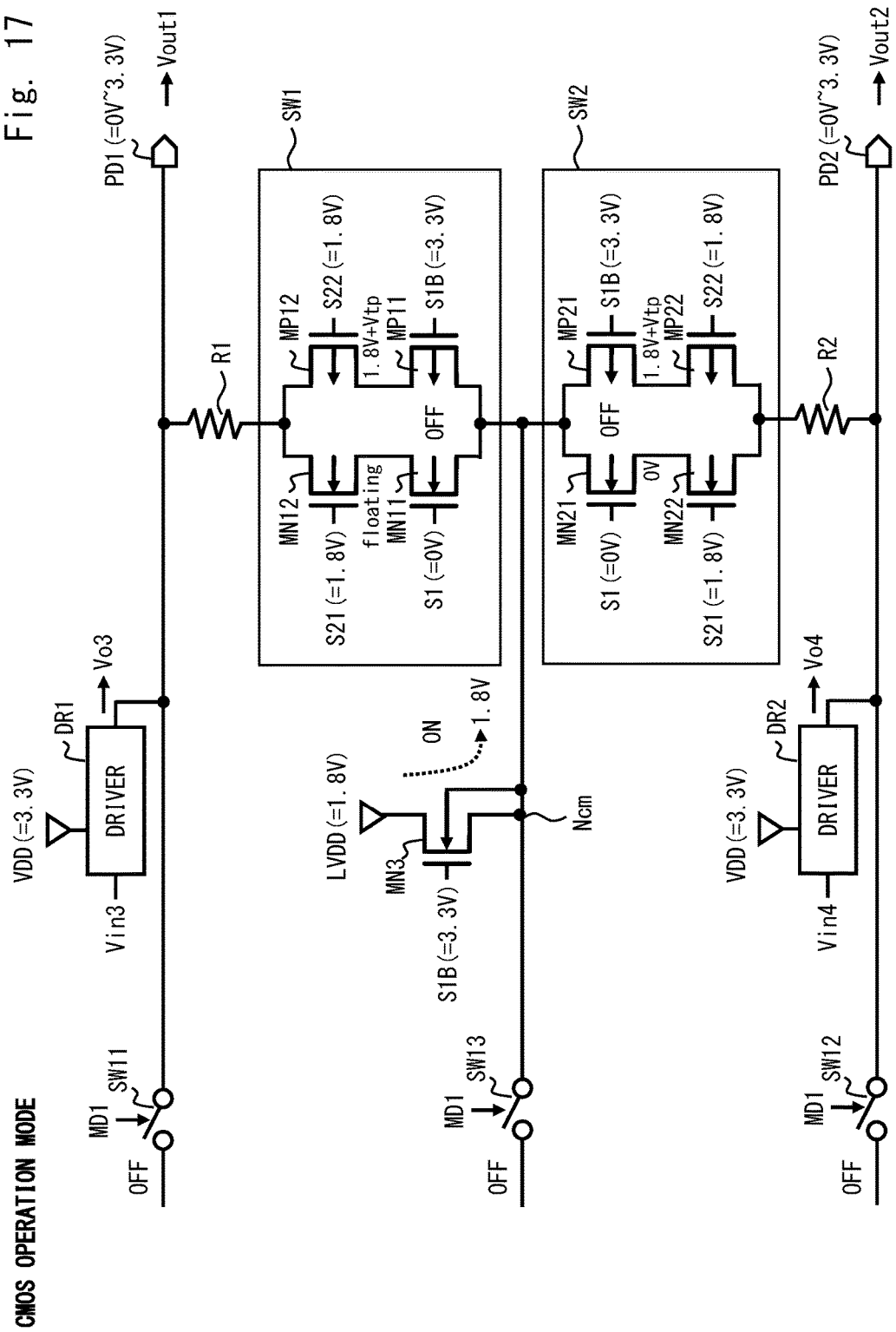
FIG. 17 is a diagram for describing a voltage application state in each of the switch units SW1-SW3 shown in FIG. 15 in the CMOS operation mode.

FIG. 17 is a diagram for describing a voltage application state in each of the switch units SW1, SW2, and SW3c in the CMOS operation mode. As shown in FIG. 17, in the CMOS operation mode, the control signal S1B having a voltage 3.3 V is applied to the gate of the transistor MN3. Accordingly, the transistor MN3 is turned on since the gate-source voltage becomes equal to or larger than the threshold voltage. As a result, the clamp voltage having the voltage of 1.8 V is supplied to the node Ncm which has been in the floating state.

Figure 18:
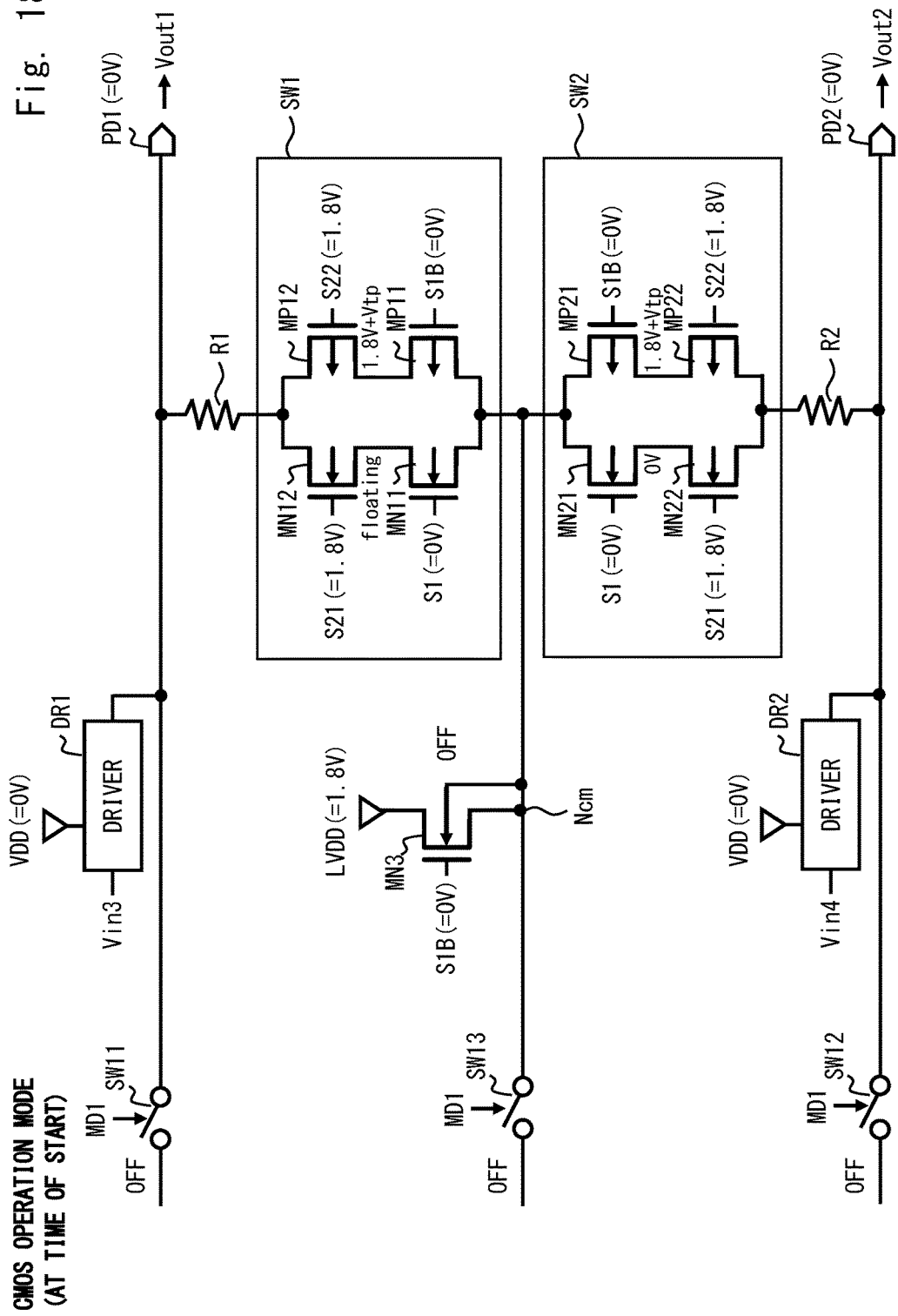
FIG. 18 is a diagram for describing a voltage application state in each of the switch units SW1-SW3 shown in FIG. 15 at the start of the CMOS operation mode.

FIG. 18 is a diagram for describing a voltage application state in each of the switch units SW1, SW2, and SW3c at the start of the CMOS operation mode. FIG. 18 shows an example of a state in which the first power supply voltage VDD1 (1.8 V) is supplied but before the second power supply voltage VDD2 (3.3 V) is supplied. In this case, the transistor MN3 is not unintentionally turned on. It is therefore possible to prevent an unintended flow of leak current via the transistor MN3, the node Ncm, the transistor MP11, and the transistor MP12.

As stated above, the semiconductor device 1 is able to bring about effects substantially equal to those when the embodiment is not modified even when the switch unit SW3c is used as a modified example of the switch unit SW3.

Further, it is possible to prevent the leakage current at the start of the CMOS operation mode.

Second Embodiment

Figure 19:
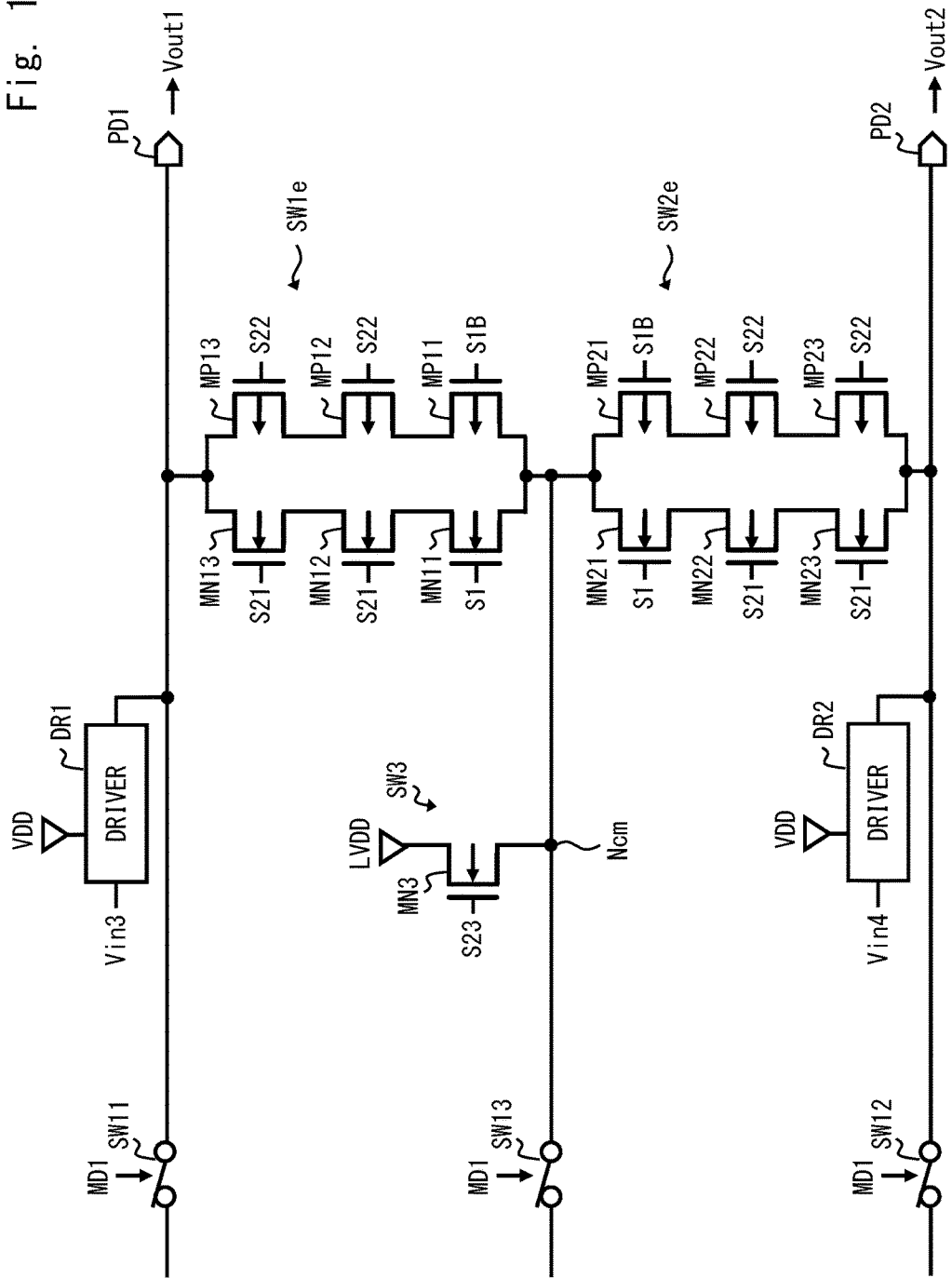
FIG. 19 is a circuit diagram showing a specific configuration example of a part of a semiconductor device according to a second embodiment.

FIG. 19 is a diagram showing a configuration example of a part of a semiconductor device 2 according to a second embodiment.

The semiconductor device 2 shown in FIG. 19 is different from the semiconductor device 1 in that the semiconductor device 2 includes transistors MN13 and MN14 in place of the resistance element R1 provided in the semiconductor device 1 and transistors MN23 and MN24 in place of the resistance element R2 provided in the semiconductor device 1. In the example shown in FIG. 19, the transistors MN11-MN13 and MP11-MP13 form a switch unit SW1e and the transistors MN21-MN23 and MP21-MP23 form a switch unit SW2e. Since the other configurations of the semiconductor device 2 are similar to those of the semiconductor device 1, the descriptions thereof will be omitted.

As shown in FIG. 19, the transistor MN13 is an N-channel MOS transistor and is provided in series with the transistor MN12. The transistor MN13 and the transistor MN12 are controlled to be turned on or off by the control signal S21. The transistor MP13 is a P-channel MOS transistor and is provided in series with the transistor MP12. The transistor MP13 and the transistor MP12 are controlled to be turned on or off by the control signal S22.

That is, at least the ON resistances of the transistors MP13 and MN13 serve as the resistance element R1. Besides the ON resistances of the transistors MP13 and MN13, the ON resistances of the transistors MP12 and MN12 may also serve as the resistance element R1. The transistors MP13 and MN13 may further be provided in a plurality of stages in series with each other.

Further, the transistor MN23 is an N-channel MOS transistor and is provided in series with the transistor MN22. The transistor MN23 and the transistor MN22 are controlled to be turned on or off by the control signal S21. The transistor MP23 is a P-channel MOS transistor and is provided in series with the transistor MP22. The transistor MP23 and the transistor MP22 are controlled to be turned on or off by the control signal S22.

That is, at least the ON resistances of the transistors MP23 and MN23 serve as the resistance element R2. Besides the ON resistances of the transistors MP23 and MN23, the ON resistances of the transistors MP22 and MN22 may also serve as the resistance element R2. The transistors MP23 and MN23 may further be provided in a plurality of stages in series with each other.

Figure 20:
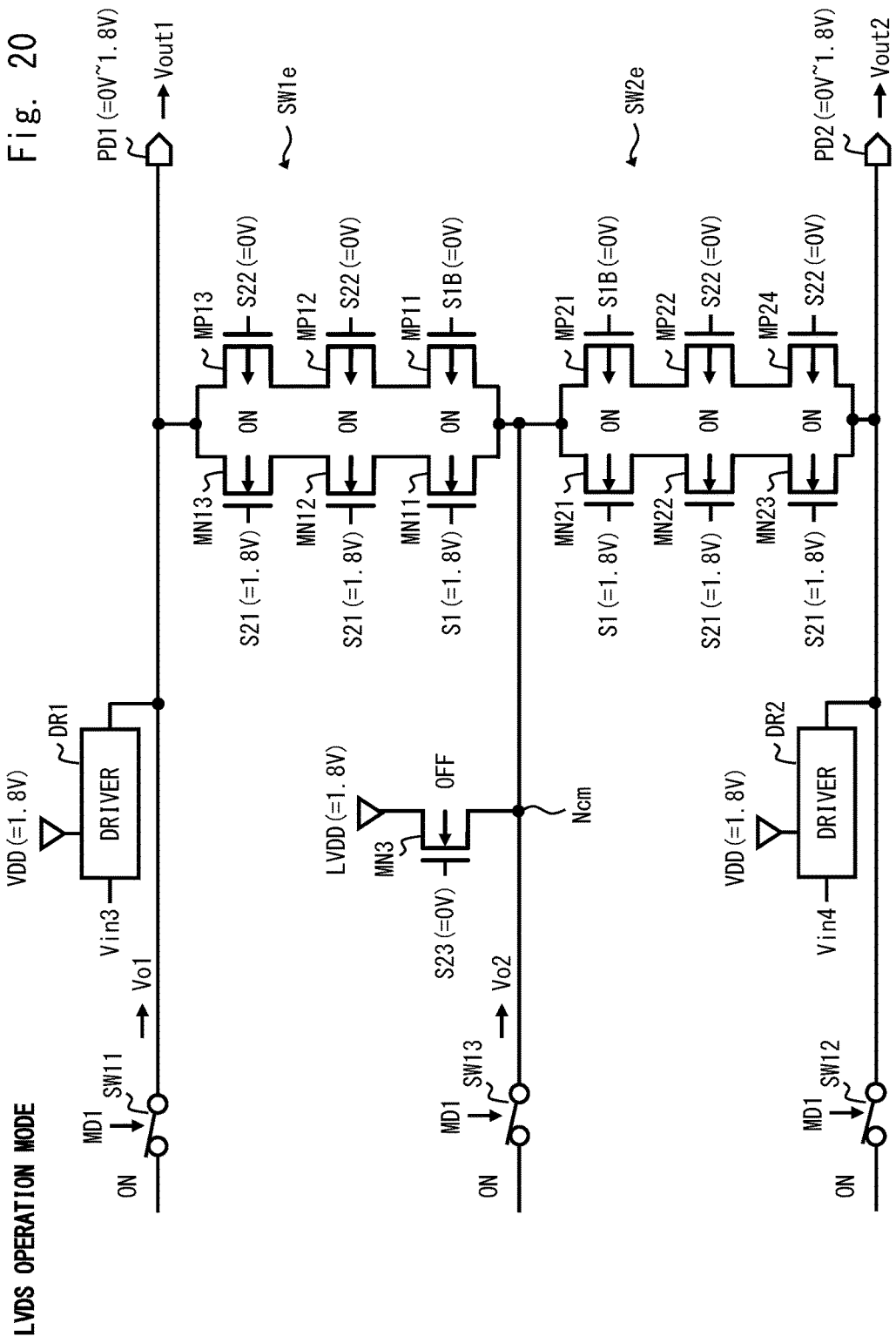
FIG. 20 is a diagram for describing a voltage application state in each of switch units SW1-SW3 shown in FIG. 19 in an LVDS operation mode.
Figure 21:
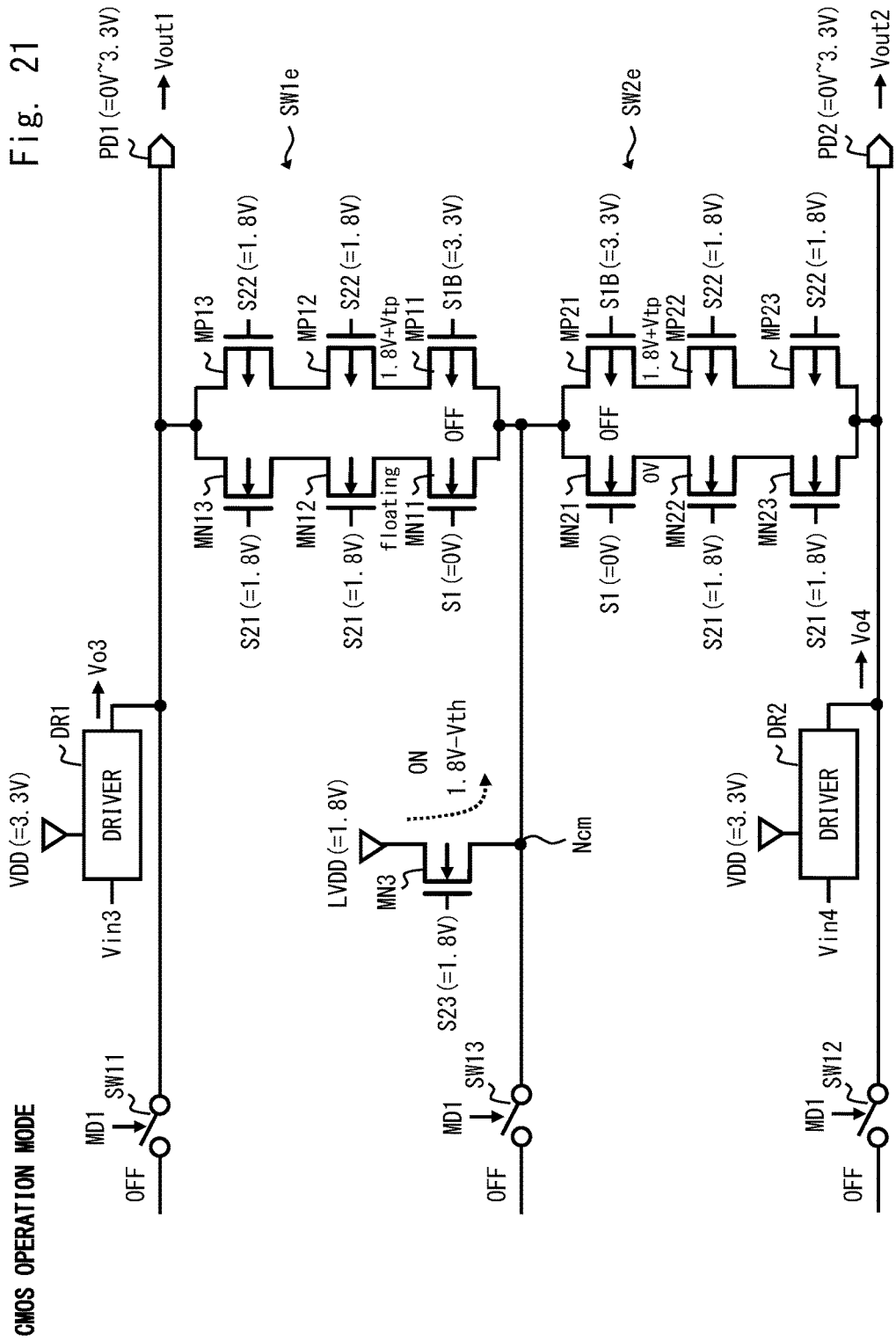
FIG. 21 is a diagram for describing a voltage application state in each of the switch units SW1-SW3 shown in FIG. 19 in a CMOS operation mode.

FIG. 20 is a diagram for describing a voltage application state in each of switch units SW1e, SW2e, and SW3 in the LVDS operation mode. FIG. 21 is a diagram for describing a voltage application state in each of the switch units SW1e, SW2e, and SW3 in the CMOS operation mode. Since the examples shown in FIGS. 20 and 21 are similar to the examples shown in FIGS. 10 and 11 except that the transistors MN13, MP13, MN23, and MP23 are controlled to be turned on or off, similar to the transistors MN12, MP12, MN22, and MP22. Therefore, the descriptions regarding FIGS. 20 and 21 will be omitted.

As described above, the semiconductor device 2 is able to bring about the effects substantially equal to those of the semiconductor device 1. Further, the resistance elements R1 and R2 are not necessary, whereby it is possible to suppress the increase in the size of the circuit. In the CMOS operation mode, the node between the transistors MN11 and MN12 (this node is referred to as a node Nx) is in the floating state. However, while the multi-stage transistors MN12 and MN13 are provided between the node Nx and the external output terminal PD1, only the single-stage transistor MN11 is provided between the node Nx and the node Ncm. Therefore, the leakage current tends to flow out to the side of the transistor MN11. Therefore, the potential of the node Nx between the transistors MN11 and MN12 is stably maintained at around the potential of the node Ncm. It is therefore possible to prevent a voltage that exceeds the withstand voltage from being applied to the transistors MN11 and MN12.

As described above, the semiconductor devices 1 and 2 according to the aforementioned first and second embodiments selectively output the low voltage differential signaling (LVDS) data signals or the single end signaling data signals from the external output terminals PD1 and PD2 depending on the specification or the like. Accordingly, the semiconductor devices 1 and 2 according to the aforementioned first and second embodiments are able to reduce the number of external output terminals, whereby it is possible to suppress the increase in the size of the circuit.

The semiconductor devices 1 and 2 according to the aforementioned first and second embodiments further include, besides transistors for switching, transistors for voltage relaxation as components of the respective switch units SW1 and SW2. The semiconductor devices 1 and 2 according to the aforementioned first and second embodiments further include a transistor that supplies the clamp voltage to the feedback line (node Ncm) which is in the floating state in the CMOS operation mode. The semiconductor device 1 therefore helps to prevent breakdown of the transistors that form the respective switch units SW1-SW3.

While the invention made by the present inventors has been specifically described based on the embodiments, it is needless to say that the present invention is not limited to the embodiments stated above and may be changed in various ways without departing from the spirit of the present invention.

For example, in the semiconductor device according to the above embodiments, the conductive type (p-type or n-type) of each of a semiconductor substrate, a semiconductor layer, or a diffusion layer (diffusion region) may be inverted. Therefore, when one conductive type of the n type and the p type is a first conductive type and the other one of the n type and the p type is a second conductive type, the first conductive type may be the p type and the second conductive type may be the n type and vice versa.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. A semiconductor device comprising:
 a differential amplification circuit that amplifies differential input signals and outputs differential output signals;

first and second output terminals to which one of the differential output signals and first and second single end signals is selectively supplied according to an operation mode;

a feedback line;

first and second switch units that control a conduction state between the first output terminal and the feedback line and a conduction state between the second output terminal and the feedback line, respectively;

first and second resistance elements respectively provided in series with the first and second switch units;

a common mode feedback circuit that controls a common mode voltage of the differential amplification circuit according to a difference between a voltage of the feedback line and a reference voltage; and a third switch unit that controls whether to supply a predetermined clamp voltage to the feedback line.

2. The semiconductor device according to claim 1, wherein:

the first switch unit comprises:

a first switch transistor that is provided between the first output terminal and the feedback line and is controlled to be turned on or off by a first control signal having a first voltage amplitude or a second voltage amplitude larger than the first voltage amplitude in accordance with the level of a power supply voltage switched depending on an operation mode; and a first voltage relaxation transistor that is provided between the first output terminal and the first switch transistor and is controlled to be turned on or off by a second control signal having the first voltage amplitude, and the second switch unit comprises:

a second switch transistor that is provided between the second output terminal and the feedback line and is controlled to be turned on or off by a third control signal having the first voltage amplitude or the second voltage amplitude in accordance with the level of the power supply voltage; and a second voltage relaxation transistor that is provided between the second output terminal and the second switch transistor and is controlled to be turned on or off by a fourth control signal having the first voltage amplitude.

3. The semiconductor device according to claim 2, wherein the first and third control signals have the first voltage amplitude corresponding to a voltage amplitude of the differential output signals in a first mode in which the differential output signals are supplied to the first and second output terminals and have the second voltage amplitude corresponding to a voltage amplitude of the first and second single end signals in a second mode in which the first and second single end signals are supplied to the first and second output terminals.

4. The semiconductor device according to claim 3, wherein each of the first and second switch transistors and the first and second voltage relaxation transistors is formed of a transistor having a withstand voltage lower than the power supply voltage supplied in the second mode.

5. The semiconductor device according to claim 2, wherein the third switch unit includes a P-channel MOS transistor having a source to which the clamp voltage is supplied, a gate to which a fifth control signal having the first voltage amplitude is supplied, and a drain connected to the feedback line.

6. The semiconductor device according to claim 2, wherein the third switch unit includes an N-channel MOS transistor having a drain to which the clamp voltage is supplied, a gate to which a fifth control signal having the first voltage amplitude is supplied, and a source connected to the feedback line.

7. The semiconductor device according to claim 2, wherein the third switch unit includes a depletion-type N-channel MOS transistor having a drain to which the clamp voltage is supplied, a gate to which a fifth control signal having the first voltage amplitude is supplied, and a source connected to the feedback line.

8. The semiconductor device according to claim 2, wherein the third switch unit includes an N-channel MOS transistor having a drain to which the clamp voltage is supplied, a gate to which a fifth control signal having the second voltage amplitude is supplied, and a source and a back gate connected to the feedback line.

9. The semiconductor device according to claim 2, wherein:

the first resistance element comprises a third voltage relaxation transistor that is provided between the first output terminal and the first switch unit and is controlled to be turned on or off by the second control signal, and the second resistance element comprises a fourth voltage relaxation transistor that is provided between the second output terminal and the second switch unit and is controlled to be turned on or off by the fourth control signal.

10. The semiconductor device according to claim 1, wherein:

the first and second switch units are controlled to be turned on and the third switch unit is controlled to be turned off in a first mode in which the differential output signals are supplied to the first and second output terminals, and the first and second switch units are controlled be turned off and the third switch unit is controlled to be turned on in a second mode in which the first and second single end signals are supplied to the first and second output terminals.

11. The semiconductor device according to claim 10, further comprising a controller that controls the first to third switch units so that the first and second switch units are turned on and the third switch unit is turned off in the first mode and the first and second switch units are turned off and the third switch unit is turned on in the second mode.

12. The semiconductor device according to claim 1, wherein a voltage range of the first single end signal is wider than a voltage range of one of the differential output signals and a voltage range of the second single end signal is wider than a voltage range of the other one of the differential output signals.

13. A semiconductor system comprising:

the semiconductor device according to claim 1; and a liquid crystal display device driven by an output signal of the semiconductor device.

14. A control method of a semiconductor device, the control method comprising:

in a first mode, connecting a first output terminal and a feedback line via a first resistance element and connecting a second output terminal and the feedback line via a second resistance element by turning on both first and second switch units;

controlling a common mode voltage of a differential amplification circuit according to a difference between a voltage on the feedback line and a reference voltage; and outputting one of differential output signals output from the differential amplification circuit in accordance with differential input signals to outside via the first output terminal and outputting the other one of the differential output signals output from the differential amplification circuit in accordance with the differential input signals to outside via the second output terminal, and in a second mode, disconnecting the connection between the first output terminal and the feedback line and the connection between the second output terminal and the feedback line by turning off both the first and second switch units;

supplying a predetermined clamp voltage to the feedback line; and outputting first and second single end signals to outside via the first and second output terminals, respectively.

15. The control method of the semiconductor device according to claim 14, wherein:

the first switch unit comprises:

a first switch transistor that is provided between the first output terminal and the feedback line and is controlled to be turned on or off by a first control signal having a first voltage amplitude or a second voltage amplitude larger than the first voltage amplitude in accordance with a level of a power supply voltage switched depending on an operation mode; and a first voltage relaxation transistor that is provided between the first output terminal and the first switch transistor and is controlled to be turned on or off by a second control signal having the first voltage amplitude, and the second switch unit comprises:

a second switch transistor that is provided between the second output terminal and the feedback line and is controlled to be turned on or off by a third control signal having the first voltage amplitude or the second voltage amplitude in accordance with the level of the power supply voltage; and a second voltage relaxation transistor that is provided between the second output terminal and the second switch transistor and is controlled to be turned on or off by a fourth control signal having the first voltage amplitude.

16. The control method of the semiconductor device according to claim 14, wherein a voltage range of the first single end signal is wider than a voltage range of one of the differential output signals and a voltage range of the second single end signal is wider than a voltage range of the other one of the differential output signals.

17. The semiconductor device according to claim 1, wherein the third switch unit controls to supply the predetermined clamp voltage to the feedback line according to the operation mode.

* * * * *